United States Patent
Nega et al.

(10) Patent No.: US 12,142,411 B2
(45) Date of Patent: Nov. 12, 2024

(54) ISOLATOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Nega, Yokohama Kanagawa (JP); Yoshihiko Fuji, Oita Oita (JP); Tatsuya Ohguro, Yokohama Kanagawa (JP); Takanobu Kamakura, Yokosuka Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 643 days.

(21) Appl. No.: 17/016,205

(22) Filed: Sep. 9, 2020

(65) Prior Publication Data

US 2021/0296043 A1    Sep. 23, 2021

(30) Foreign Application Priority Data

Mar. 19, 2020 (JP) .................... 2020-049624

(51) Int. Cl.
*H01F 27/28* (2006.01)
*H01F 27/36* (2006.01)
(Continued)

(52) U.S. Cl.
CPC ......... *H01F 27/2804* (2013.01); *H01F 27/36* (2013.01); *H04L 25/02* (2013.01); *H05K 1/0296* (2013.01); *H01F 2027/2819* (2013.01)

(58) Field of Classification Search
CPC .............. H01F 27/2804; H01F 27/36; H01F 2027/2819; H01F 2019/085; H01F 19/08;
(Continued)

(56) References Cited

U.S. PATENT DOCUMENTS 5,502,430 A * 3/1996 Takahashi ........... H01F 27/2823
                                                       336/225
9,431,379 B2   8/2016 Kerber et al.
(Continued)

FOREIGN PATENT DOCUMENTS

JP       2003124027 A  *  4/2003
JP       2008-103526 A     5/2008
(Continued)

OTHER PUBLICATIONS

Notice of Reasons for Refusal mailed Jul. 30, 2024 in corresponding Japanese Patent Application No. 2023-127282, with English machine translation, 13 pages.

*Primary Examiner* — Malcolm Barnes
(74) *Attorney, Agent, or Firm* — Kim & Stewart LLP

(57) ABSTRACT

An isolator includes a substrate; a first planar coil provided above the substrate and along a surface of the substrate; a first insulating portion on the first planar coil; a second planar coil on the first insulating portion; and a metal layer above the first insulating portion. The first planar coil, the second planar coil, and the metal layer are arranged in a first direction perpendicular to the surface of the substrate. The first planar coil and the second planar coil each having a center and an outer perimeter in a second direction along the surface of the substrate. A distance in the second direction from the center of the first planar coil to the outer perimeter of the first planar coil is less than a distance in the second direction from the center of the second planar coil to the outer perimeter of the second planar coil.

15 Claims, 23 Drawing Sheets

(51) Int. Cl.
*H04L 25/02* (2006.01)
*H05K 1/02* (2006.01)

(58) Field of Classification Search
CPC .............. H01F 27/2885; H01F 5/003; H01F 2017/007; H01F 27/2871; H01F 27/29; H01F 5/04; H01L 23/552; H01L 23/49811; H01L 23/49838; H01L 23/645; H04L 25/02; H05K 1/0296
See application file for complete search history.

(56) References Cited

U.S. PATENT DOCUMENTS

| | | | |
|---|---|---|---|
| 9,520,354 B1* | 12/2016 | Chow | H01L 28/40 |
| 2011/0176339 A1 | 7/2011 | Kerber et al. | |
| 2017/0092413 A1* | 3/2017 | Matsunaga | H01F 27/2804 |
| 2020/0082977 A1 | 3/2020 | Ishihara | |
| 2020/0294713 A1* | 9/2020 | Murakami | C03C 3/091 |
| 2020/0343037 A1* | 10/2020 | Chen | H01F 27/2871 |
| 2021/0296043 A1 | 9/2021 | Nega et al. | |

FOREIGN PATENT DOCUMENTS

| | | | |
|---|---|---|---|
| JP | 2009171333 A | * | 7/2009 |
| JP | 2020-043178 A | | 3/2020 |
| JP | 2021-150839 A | | 9/2021 |

\* cited by examiner

12,142,411 B2

ISOLATOR

CROSS-REFERENCE TO RELATED APPLICATIONS

This application is based upon and claims the benefit of priority from Japanese Patent Application No. 2020-049624, filed on Mar. 19, 2020; the entire contents of which are incorporated herein by reference.

FIELD

Embodiments relate to an isolator.

BACKGROUND

An isolator transmits a signal by utilizing the change of a magnetic field or an electric field in a state in which the current is blocked. It is desirable that breakdown of the isolator does not occur easily.

DETAILED DESCRIPTION

According to one embodiment, an isolator includes a substrate; a first planar coil provided above the substrate and along a surface of the substrate; a first insulating portion provided on the first planar coil; a second planar coil provided on the first insulating portion; and a metal layer provided above the first insulating portion. The first planar coil, the second planar coil, and the metal layer are arranged in a first direction perpendicular to the surface of the substrate. The first planar coil and the second planar coil each having a center and an outer perimeter in a second direction along the surface of the substrate. A distance in the second direction from the center of the first planar coil to the outer perimeter of the first planar coil is less than a distance in the second direction from the center of the second planar coil to the outer perimeter of the second planar coil.

Embodiments will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

The same portions inside the specification and drawings are marked with the same numerals; a detailed description is omitted as appropriate.

First Embodiment

Figure 1:
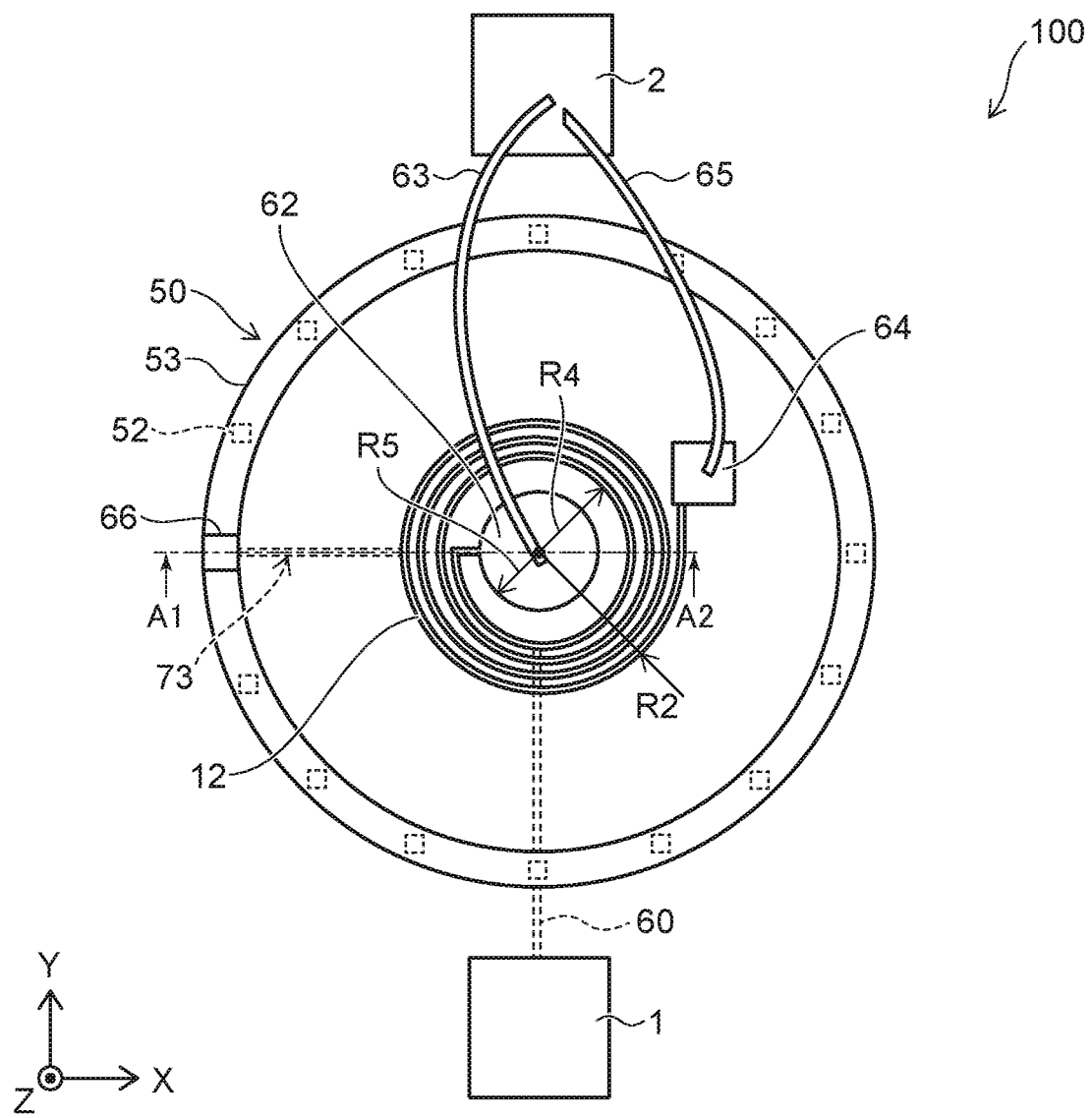
FIG. 1 is a plan view illustrating an isolator according to a first embodiment.

FIG. 1 is a plan view illustrating an isolator 100 according to a first embodiment.

Figure 2:
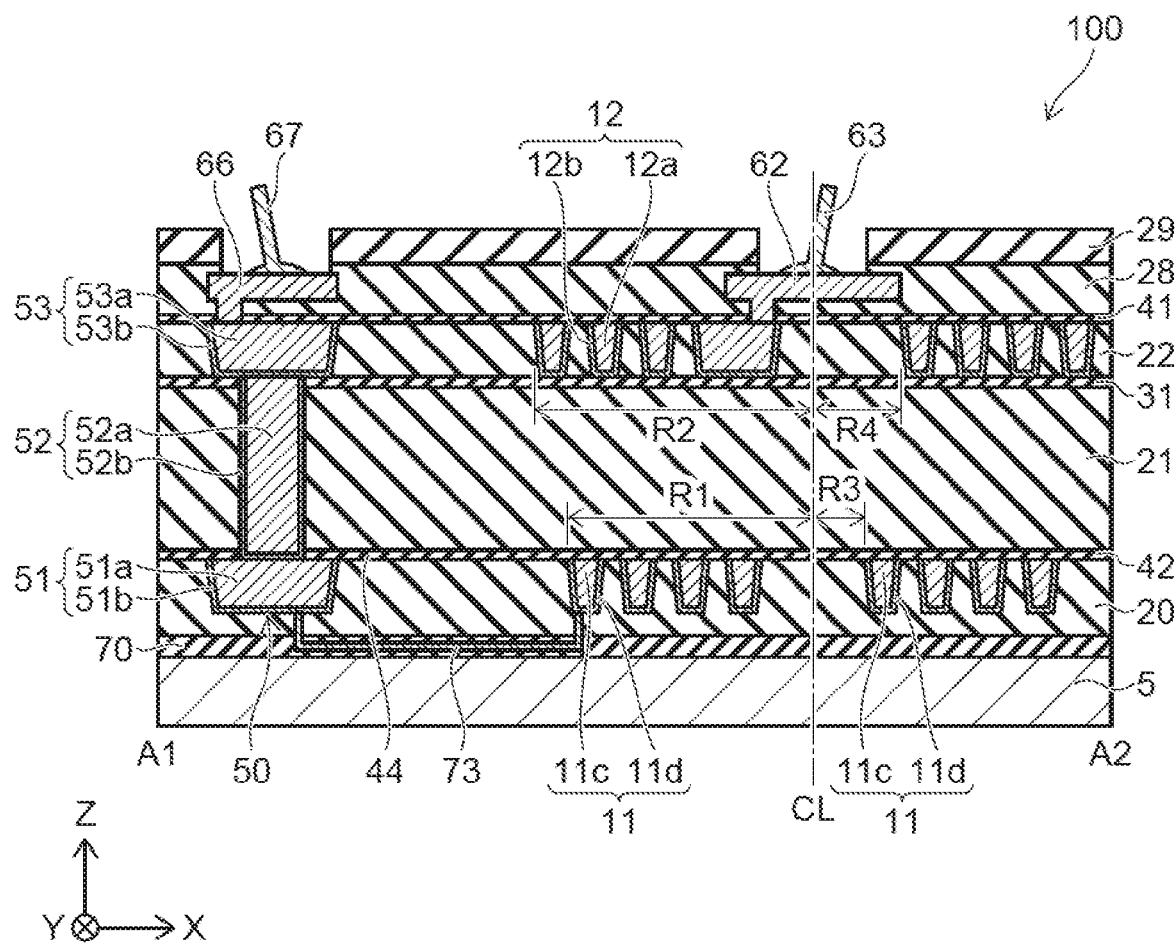
FIG. 2 is a cross-sectional view illustrating an isolator according to a first embodiment.

FIG. 2 is an A1-A2 cross-sectional view of FIG. 1.

For example, the first embodiment relates to a device so-called a digital isolator, a galvanic isolator, or a galvanic isolation element. As illustrated in FIGS. 1 and 2, the isolator 100 according to the first embodiment includes a first circuit 1, a second circuit 2, a substrate 5, a first planar coil 11, a second planar coil 12, a first insulating portion 21, a second insulating portion 22, an insulating portion 28, an insulating portion 29, a dielectric portion 31, a dielectric portion 41, a dielectric portion 42, a conductive body 50, a metal layer 62, and an interconnection layer 70. The insulating portions 28 and 29 are not illustrated in FIG. 1.

For example, the first planar coil 11, the second planar coil 12, and the metal layer 62 have circular outer perimeters and are disposed to share, for example, a center line CL in a direction perpendicular to a surface of the substrate 5 (e.g., in the Z-direction). The outer perimeters of the first planar coil 11, the second planar coil 12, and the metal layer 62 are not limited to circular and may be, for example, polygonal, elliptic, etc.

As illustrated in FIG. 2, an insulating portion 20 is provided on the substrate 5 with the interconnection layer 70 interposed. The first planar coil 11 is provided inside the insulating portion 20. The first insulating portion 21 is provided on the first planar coil 11 and the insulating portion 20. The second planar coil 12 is provided on the first insulating portion 21. The second insulating portion 22 is provided around the second planar coil 12 along the X-Y plane perpendicular to the Z-direction (e.g., along a first plane). The second insulating portion 22 contacts the second planar coil 12.

In the example illustrated in FIGS. 1 and 2, the first planar coil 11 and the second planar coil 12 are provided in spiral configurations along the X-Y plane. The first planar coil 11 and the second planar coil 12 face each other in the Z-direction. At least a portion of the first planar coil 11 and at least a portion of the second planar coil 12 are arranged in the Z-direction.

In the Z-direction, the dielectric portion 31 is provided between the first insulating portion 21 and the second insulating portion 22. The dielectric portion 31 includes a portion provided between the first insulating portion 21 and the second planar coil 12. The dielectric portion 31 contacts the second planar coil 12.

The dielectric portion 41 is provided on the second planar coil 12 and the second insulating portion 22. For example, the dielectric portion 41 contacts the second planar coil 12 and the second insulating portion 22.

The conductive body 50 is provided around the first planar coil 11 and the second planar coil 12 along the first plane. Specifically, the conductive body 50 includes a first conductive portion 51, second conductive portions 52, and a third conductive portion 53. The first conductive portion 51 is provided around the first planar coil 11 along the X-Y plane. The second conductive portions 52 are provided on a portion of the first conductive portion 51. Multiple second conductive portions 52 are provided along the first conductive portion 51. The third conductive portion 53 is provided on the multiple second conductive portions 52. The third conductive portion 53 is provided around the second planar coil 12 along the X-Y plane.

In the example illustrated in FIG. 1, one end of the first planar coil 11 is electrically connected to the first circuit 1 via wiring 60. The other end of the first planar coil 11 is electrically connected to the conductive body 50 via wiring 73.

One end of the second planar coil 12 is electrically connected to the second circuit 2 via the metal layer 62 and wiring 63. The other end of the second planar coil 12 is electrically connected to the second circuit 2 via a metal layer 64 and wiring 65. For example, the metal layer 62 is provided on the one end of the second planar coil 12. The metal layer 64 is provided on the other end of the second planar coil 12. In the Z-direction, the metal layer 62 and the metal layer 64 may be provided at the same level as the level of the second planar coil 12. The metal layers 62 and 64 may be provided to have a continuous body with the second planar coil 12.

As illustrated in FIG. 2, a metal layer 66 is provided on the conductive body 50. The conductive body 50 is electrically connected to a not-illustrated conductive member via the metal layer 66 and wiring 67. For example, the conductive body 50 and the substrate 5 are connected to a reference potential. The reference potential is, for example, a ground potential. The conductive body 50 can be prevented from having a floating potential by connecting the conductive body 50 to the reference potential. Thereby, it is possible to reduce the likelihood of unexpected dielectric breakdown that occurs between the conductive body 50 and the planar coils due to the unstable potential of the conductive body 50.

In the substrate 5, a circuit may be provided which is electrically connected to the first planar coil 11. The first circuit 1 may be included in the circuit provided on the substrate 5. In such a case, the conductive body 50 is provided on the substrate 5 with the interconnection layer 70 interposed; and the circuit is provided between the substrate 5 and the interconnection layer 70. Thus, the circuit in the substrate 5 may be shielded by the conductive body 50 from electromagnetic waves traveling toward the substrate 5 from outside the substrate 5 and the conductive body 50. As a result, the circuit may operate more stably. The interconnection layer 70 includes the interconnection 73 electrically connecting the first planar coil 11 and the conductive body 50.

The insulating portion 28 is provided along the X-Y plane around the metal layers 62 and 66. The insulating portion 29 is provided on the insulating portion 28.

One of the first circuit 1 and the second circuit 2 is used as a transmitting circuit. The other of the first circuit 1 and the second circuit 2 is used as a receiving circuit. In the description herein, the first circuit 1 is a transmitting circuit, and the second circuit 2 is a receiving circuit.

The first circuit 1 transmits a current signal to the first planar coil 11 which has a waveform suited to the transmission. When the current flows through the first planar coil 11, a magnetic field is generated and passes through the spiral of the first planar coil 11. Since at least a portion of the first planar coil 11 and at least a portion of the second planar coil 12 are arranged in the Z-direction, the generated magnetic force lines at least partially pass through the second planar coil 12. An electromotive force is induced in the second planar coil 12 by the change of the magnetic field in the second planar coil 12, and the induced current flows through the second planar coil 12. The second circuit 2 detects the current flowing through the second planar coil 12 and generates a signal corresponding to the detection result. Thereby, the signal is transmitted from the first planar coil 11 to the second planar coil 12 while the current flow is blocked (or insulated) therebetween.

Examples of the materials of the components of the isolator 100 will now be described.

The first planar coil 11, the second planar coil 12, and the conductive body 50 include, for example, metals. The first planar coil 11, the second planar coil 12, and the conductive body 50 include, for example, at least one metal selected from the group consisting of copper and aluminum. It is preferable for the first planar coil 11 and the second planar coil 12 to have low electrical resistances to suppress the heat generation while transmitting the signal. From the perspective of reducing the electrical resistance, it is preferable for the first planar coil 11 and the second planar coil 12 to include copper.

The insulating portion 20, the first insulating portion 21, the second insulating portion 22, and the insulating portion 28 include silicon and oxygen. For example, the insulating portion 20, the first insulating portion 21, the second insulating portion 22, and the insulating portion 28 include silicon oxide. The insulating portion 20, the first insulating portion 21, the second insulating portion 22, and the insulating portion 28 may further include nitrogen.

The insulating portion 29 includes an insulating resin of polyimide, polyamide, etc. The dielectric portion 31 includes, for example, silicon and nitrogen.

The dielectric portions 41 and 42 include silicon and nitrogen. For example, the dielectric portions 41 and 42 include silicon nitride.

The substrate 5 includes silicon and an impurity. The impurity is at least one selected from the group consisting of boron, phosphorus, arsenic, and antimony.

The second planar coil 12 may include a first metal layer 12a and a second metal layer 12b. The second metal layer 12b is provided between the first metal layer 12a and the first insulating portion 21, between the first metal layer 12a and the dielectric portion 31, and between the first metal layer 12a and the second insulating portion 22. The first planar coil 11 may include a third metal layer 11c and a fourth metal layer 11d. The fourth metal layer 11d is provided between the third metal layer 11c and the insulating portion 20. The first metal layer 12a and the third metal layer 11c include copper. The second metal layer 12b and the fourth metal layer 11d include tantalum. The second metal layer 12b and the fourth metal layer 11d may include stacked films of tantalum and tantalum nitride. By providing the second metal layer 12b and the fourth metal layer 11d, the metal materials included in the first metal layer 12a and the third metal layer 11c can be prevented from diffusing into the insulating portions.

The first conductive portion 51 may include metal layers 51a and 51b. The metal layer 51b is provided between the metal layer 51a and the insulating portion 20. The second conductive portion 52 may include metal layers 52a and 52b. The metal layer 52b is provided between the metal layer 52a and the first insulating portion 21 and between the metal layer 52a and the first conductive portion 51. The third conductive portion 53 may include metal layers 53a and 53b. The metal layer 53b is provided between the metal layer 53a and the second insulating portion 22, between the metal layer 53a and the dielectric portion 31, and between the metal layer 53a and the second conductive portion 52. The metal layers 51a, 52a and 53a each include copper. The metal layers 51b, 52b and 53b each include tantalum. The metal layers 51b to 53b may include stacked films of tantalum and tantalum nitride. By providing the metal layers 51b to 53b, the metal materials included in the metal layers 51a to 53a can be prevented from diffusing into the insulating portions.

In the isolator 100 according to the embodiment, when a signal is transmitted between the first planar coil 11 and the second planar coil 12, a positive voltage with respect to the first planar coil 11 is applied to the second planar coil 12. Thereby, a potential difference is generated between the first planar coil 11 and the second planar coil 12 and between the conductive body 50 and the second planar coil 12. At this time, electric field concentration occurs at the outer perimeter lower edge of the second planar coil 12, and there may be cases where dielectric breakdown occurs between the first planar coil 11 and the second planar coil 12. Therefore, it is desirable to reduce the electric field intensity in the vicinity of the lower edge LE1 (referring to FIG. 3A) and to prevent the isolator 100 from being broken.

In the isolator 100 as shown in FIG. 2, a distance R1 in the X-direction from the center of the first planar coil 11 to the outer perimeter of the first planar coil 11 is less than a distance R2 from the center of the second planar coil 12 to the outer perimeter of the second planar coil 12. A distance R3 from the center of the first planar coil 11 to the inner perimeter of the first planar coil 11 is less than a distance R4 from the center of the second planar coil 12 to the inner perimeter of the second planar coil 12. A distance R5 from the center of the metal layer 62 to the outer perimeter of the metal layer 62 is less than the distance R4 from the center of the second planar coil 12 to the inner perimeter of the second planar coil 12 (referring to FIG. 1).

The number of winds of the first planar coil 11 is equal to the number of winds of the second planar coil 12. In the example, the outer diameter of the first planar coil 11 is less than that of the second planar coil 12.

FIGS. 3A to 5B are schematic views illustrating characteristics of the isolator 100 according to the first embodiment.

FIGS. 3A, 4A, 4B, 5A, and 5B are schematic cross-sectional views illustrating the electric field intensity distribution between the first planar coil 11 and the second planar coil 12.

Figure 3A:
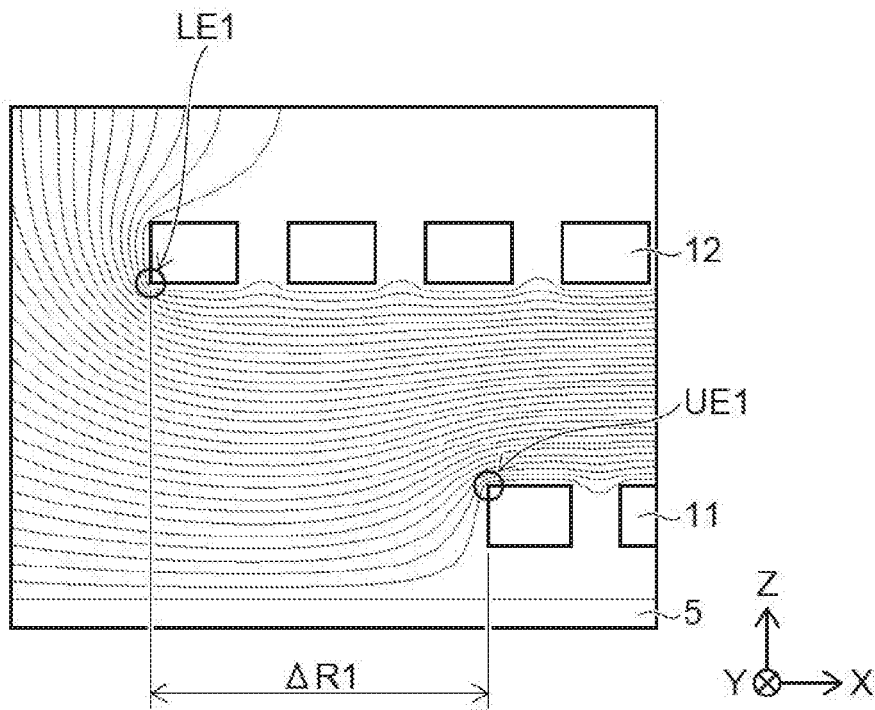
FIGS. 3A and 3B are schematic views illustrating characteristics of the isolator according to the first embodiment.

FIG. 3A shows equipotential surfaces between the first planar coil 11 and the second planar coil 12. The electric field intensity is higher where the spacing between the equipotential surfaces is narrower, and the electric field intensity decreases as the spacing between the equipotential surfaces increases. This is similar for the electric field distributions of the following drawings.

As shown in FIG. 3A, the electric field intensity is high at an upper edge UE1 of the outer perimeter in the first planar coil 11 and the lower edge LE1 of the outer perimeter in the second planar coil 12. The electric field intensity at the lower edge LE1 of the second planar coil 12 is greater than the electric field intensity at the upper edge UE1 of the first planar coil 11.

Figure 3B:
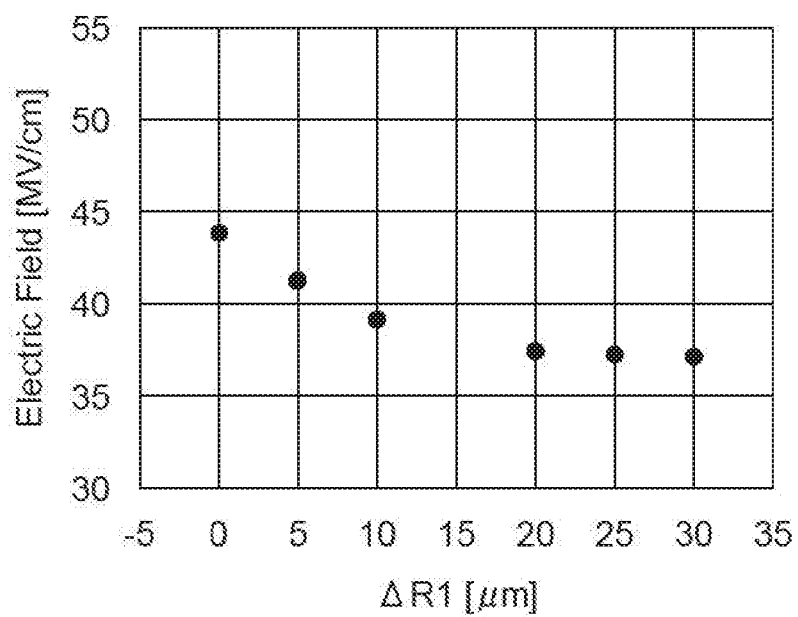

FIG. 3B is a graph illustrating the electric field intensity at the lower edge LE1 of the outer perimeter in the second planar coil 12. The vertical axis is the electric field intensity at the lower edge LE1. The horizontal axis is a difference $\Delta R1$ ($=R2-R1$) between the distance R2 and the distance R1. R1 is the distance from the center of the first planar coil 11 to the outer perimeter of the first planar coil 11. R2 is the distance from the center of the second planar coil 12 to the outer perimeter of the second planar coil 12.

As shown in FIG. 3B, the electric field intensity at the lower edge LE1 decreases as $\Delta R1$ increases. In other words, as $\Delta R1$ is increased, the electric field concentration can be relaxed at the lower edge LE1 of the second planar coil 12 and the upper edge UE1 of the first planar coil 11, and the dielectric breakdown can be avoided between the first planar coil 11 and the second planar coil 12.

Figure 4A:
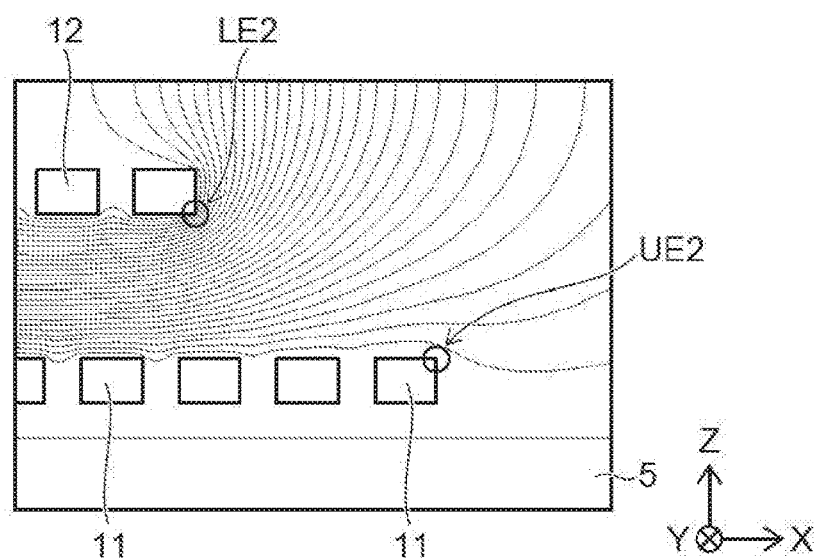
FIGS. 4A to 4C are schematic views illustrating characteristics of the isolator according to the first embodiment.
Figure 4B:
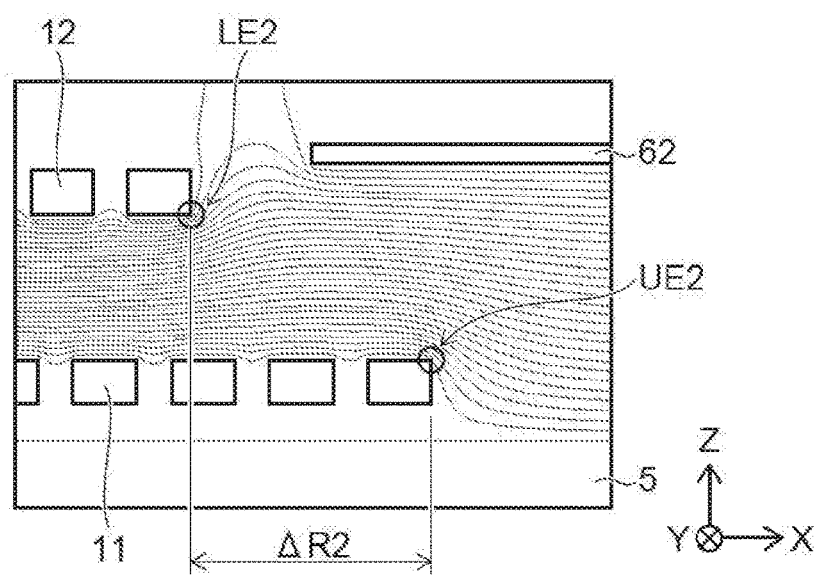

FIGS. 4A and 4B are cross-sectional views illustrating the electric field distribution around the inner perimeters of the first planar coil 11 and the second planar coil 12. The inner perimeter edge of the first planar coil 11 is provided at the position more proximate to the center line CL (referring to FIG. 2) than the position of the inner perimeter edge of the second planar coil 12.

In the example shown in FIG. 4A, electric field concentration occurs at the lower edge LE2 of the inner perimeter in the second planar coil 12. In the example shown in FIG. 4B, the metal layer 62 is provided at the center of the second planar coil 12 (referring to FIG. 1). The metal layer 62 is provided, for example, at a position in the Z-direction higher than the level of the upper surface of the second planar coil 12.

Figure 4C:
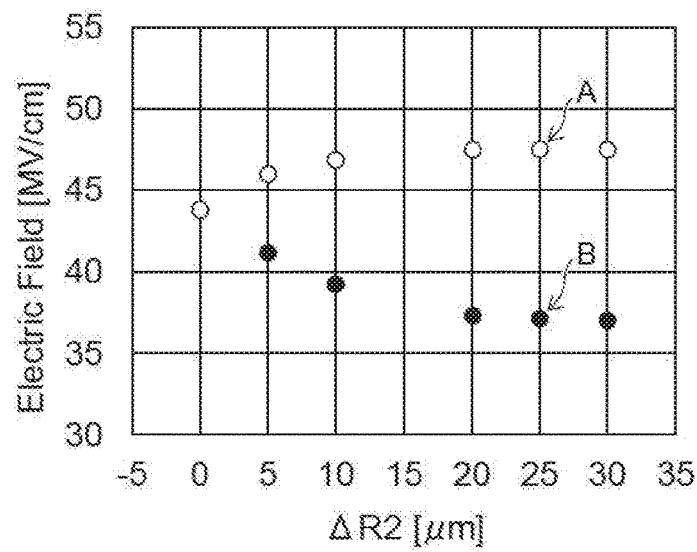

FIG. 4C is a graph illustrating the electric field intensity at the lower edge LE2 of the inner perimeter in the second planar coil 12. The vertical axis is the electric field intensity at the lower edge LE2. The horizontal axis is a difference $\Delta R2$ ($=R4-R3$) between the distance R4 and the distance R3 (referring to FIG. 2). R3 is the distance from the center of the first planar coil 11 to the inner perimeter of the first planar coil 11. R4 is the distance from the center of the second planar coil 12 to the inner perimeter of the second planar coil 12.

FIG. 4C shows a characteristic A without the metal layer 62 and a characteristic B with the metal layer 62. In the characteristic A, the electric field intensity at the lower edge LE2 increases as $\Delta R2$ increases. In the characteristic B, the electric field intensity does not increase at the lower edge LE2, and decreases similarly to the electric field intensity at the lower edge LE1 in FIG. 3A as shown in FIG. 3B.

Thus, by providing the metal layer 62, the electric field concentration can be relaxed at the lower edge LE2 of the inner perimeter in the second planar coil 12, and the dielectric breakdown can be prevented between the first planar coil 11 and the second planar coil 12.

Figure 5A:
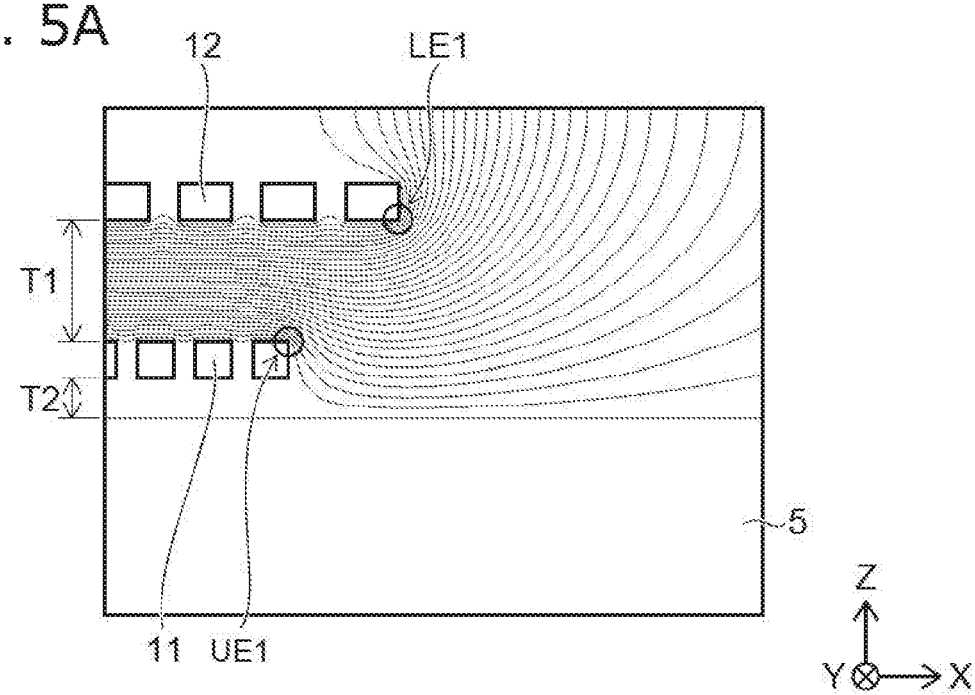
FIGS. 5A and 5B are schematic cross-sectional views illustrating characteristics of the isolator according to the first embodiment.
Figure 5B:
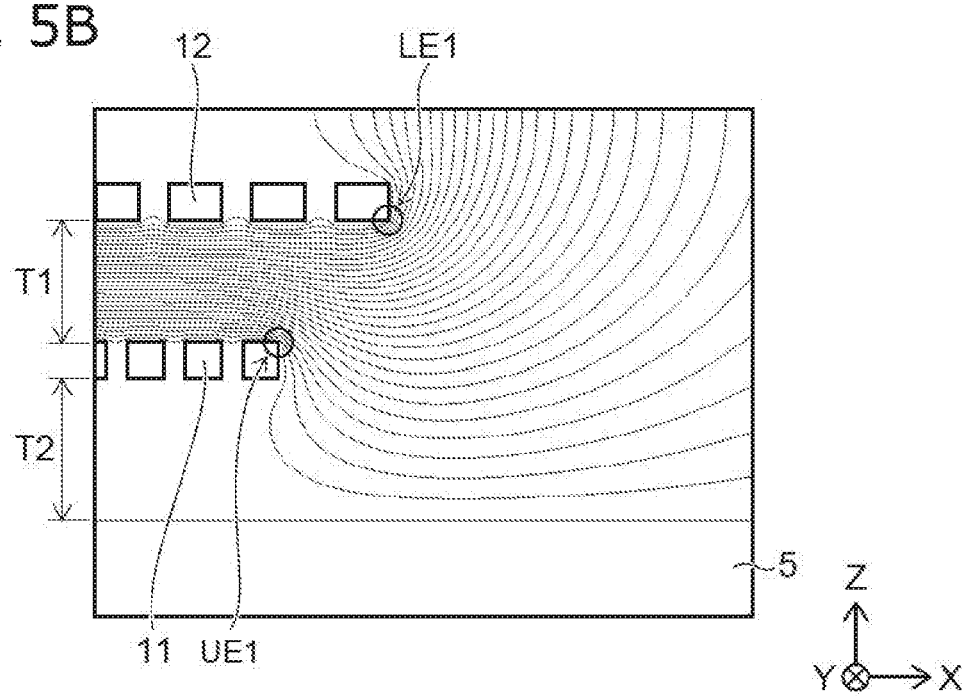

FIGS. 5A and 5B are cross-sectional views illustrating other electric field distributions at the outer perimeter of the first planar coil 11 and the second planar coil.

In the example shown in FIG. 5A, the first planar coil 11 and the second planar coil 12 is provided with a spacing T1 in the Z-direction. The first planar coil 11 is provided above the substrate 5 with a spacing T2 in the Z-direction. The spacing T1 between the first planar coil 11 and the second planar coil 12 is greater than a spacing T2 between the first planar coil 11 and the substrate 5.

In the example shown in FIG. 5B, the spacing T1 is less than the spacing T2. The electric field distribution generated in the example is shown in FIG. 5B. The equipotential surfaces provided around the outer perimeter edge of the first planar coil 11, and extend between the substrate 5 and the first planar coil 11. Thereby, the electric field intensity is increased at the upper edge UE1 of the outer perimeter in the first planar coil 11.

Thus, to avoid the dielectric breakdown between the first planar coil 11 and the second planar coil 12, the spacing T1 in the Z-direction between the first planar coil 11 and the second planar coil 12 is preferably greater than the spacing T2 in the Z-direction between the substrate 5 and the first planar coil 11.

Figure 6:
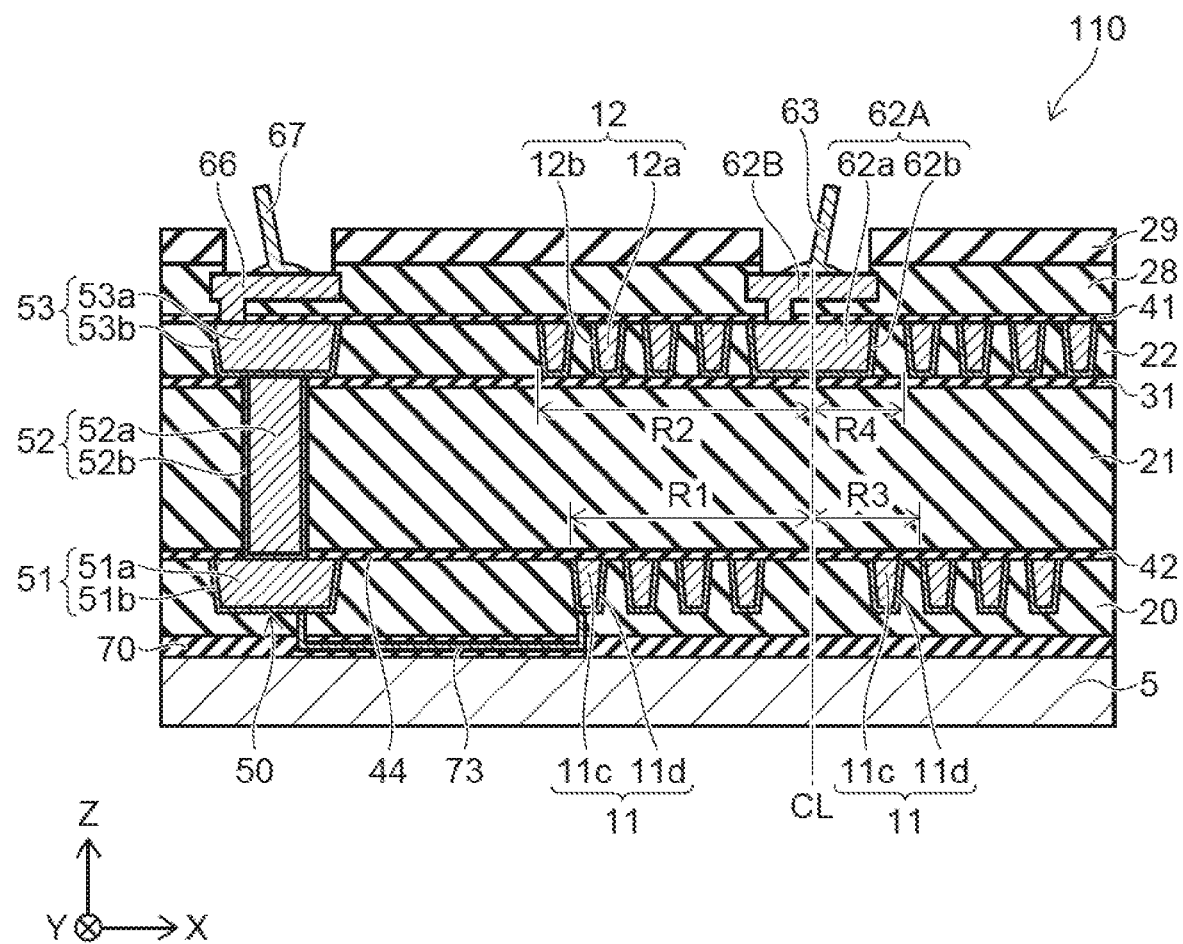
FIGS. 6 to 9 are schematic cross-sectional views respectively illustrating isolators according to modifications of the first embodiment.
Figure 7:
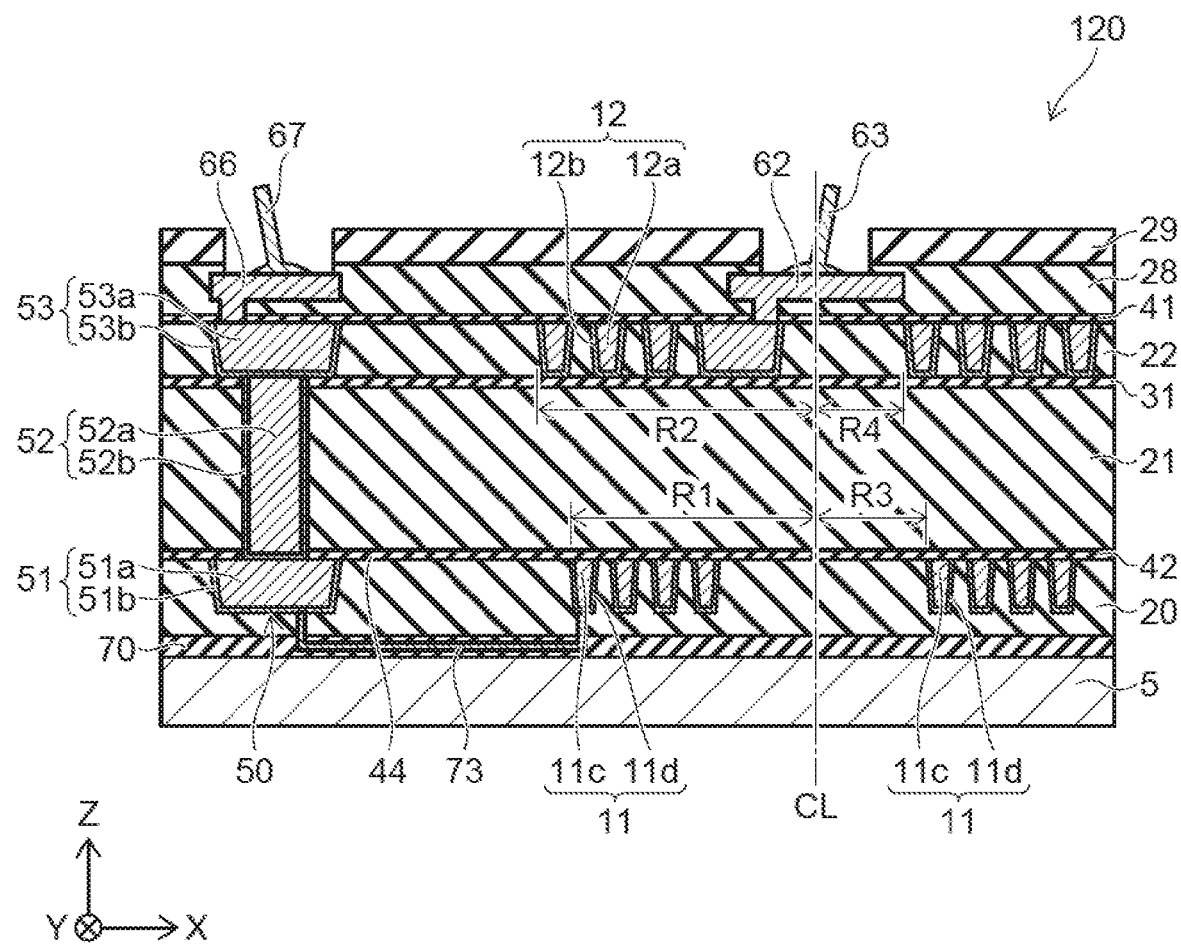
Figure 8:
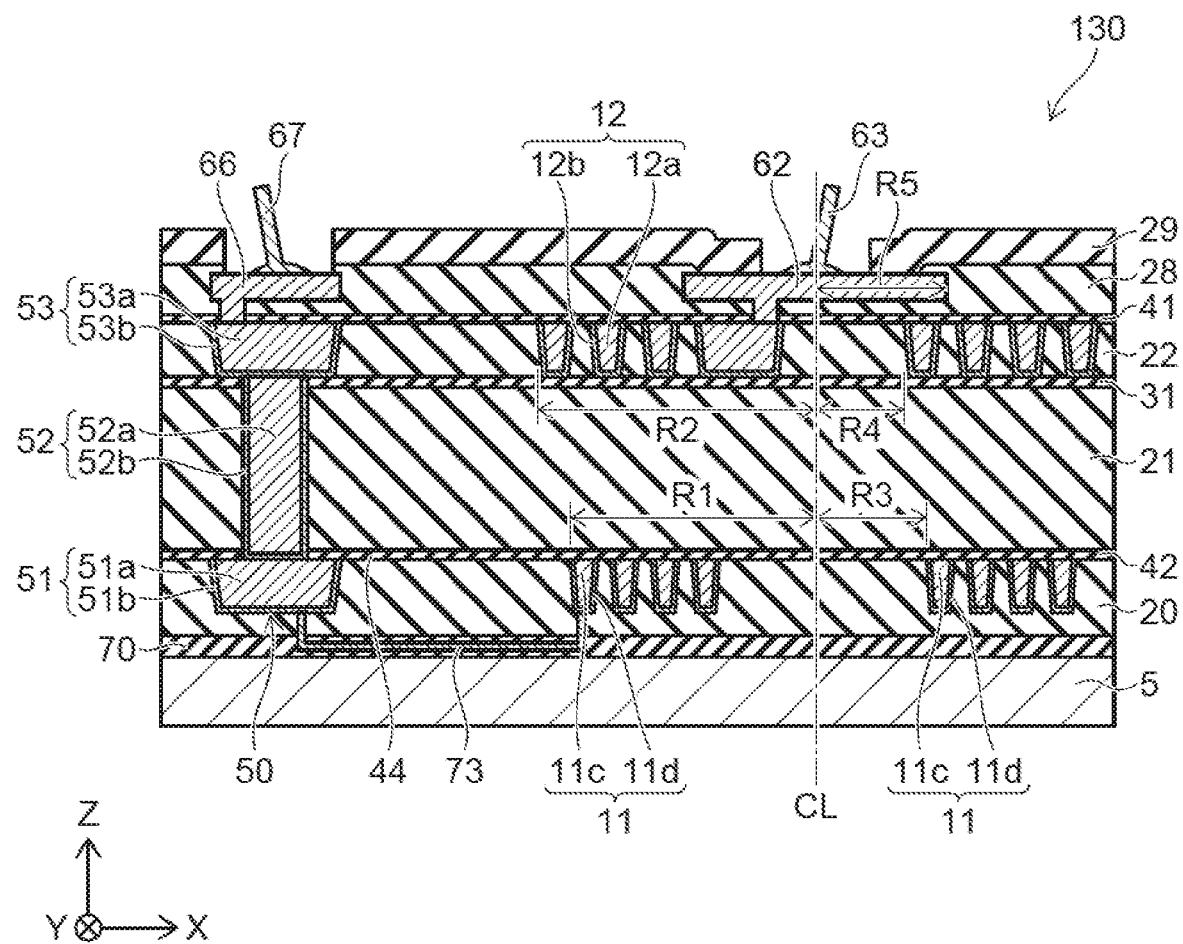

FIGS. 6 to 8 are schematic cross-sectional views respectively illustrating isolators 110, 120, and 130 according to modifications of the first embodiment.

In the isolator 110 shown in FIG. 6, the metal layer 62 is provided in a space surrounded with the inner perimeter of the second planar coil 12. The distance R5 (see FIG. 8) is less than the distance R4. R5 is the distance in the X-direction from the center of the metal layer 62 to the outer perimeter of the metal layer 62. R4 is the distance from the center of the second planar coil 12 to the inner perimeter of the second planar coil 12. The metal layer 62 is electrically connected to the second planar coil 12 at a not-illustrated portion.

The metal layer 62 includes at least a portion that faces the inner perimeter of the second planar coil 12 in a direction (e.g., the X-direction) along the surface of the substrate 5. Thereby, the electric field intensity can be reduced further at the lower edge LE2 of the inner perimeter in the second planar coil 12 (referring to FIG. 4B).

The metal layer 62 includes, for example, a metal layer 62A and a metal layer 62B. The metal layer 62A is provided at a position where the metal layer 62A faces the inner perimeter of the second planar coil 12. The metal layer 62 includes a first layer 62a and a second layer 62b. For example, the second layer 62b contacts the second insulating portion 22 and the dielectric portion 31. The second layer 62b is provided between the second insulating portion 22 and the first layer 62a and between the dielectric portion 31 and the first layer 62a. The first layer 62a includes the same material as the material of the metal layer 12a in the second planar coil 12. The second layer 62b includes the same material as the material of the metal layer 12b in the second planar coil 12.

The metal layer 62B is provided on the metal layer 62A and electrically connected to the metal layer 62A. For example, the wiring 63 is bonded on the metal layer 62B.

In the isolator 120 shown in FIG. 7, the distance R1 is less than the distance R2, and the distance R3 is greater than the distance R4. R1 is the distance from the center of the first planar coil 11 to the outer perimeter of the first planar coil 11. R2 is the distance from the center of the second planar coil 12 to the outer perimeter of the second planar coil 12. R3 is the distance from the center of the first planar coil 11 to the inner perimeter of the first planar coil 11. R4 is the distance from the center of the second planar coil 12 to the inner perimeter of the second planar coil 12.

In other words, the spacing (R1-R3) between the outer and inner perimeters of the first planar coil 11 is less than the spacing (R2-R4) between the outer and inner perimeters of the second planar coil 12. Thereby, the electric field intensity can be reduced at the lower edge LE2 of the inner perimeter in the second planar coil 12 (referring to FIGS. 3A and 3B). By providing the metal layer 62, the electric field intensity can be reduced further at the lower edge LE2 (referring to FIG. 4B).

Also, in the example, the number of winds of the first planar coil 11 is equal to the number of winds of the second planar coil 12. For example, the spacing (R1-R3) between the outer and inner perimeters of the first planar coil 11 can be reduced by reducing at least one of the width in the X-direction of the winding of the first planar coil 11 or the width of the space between the windings of the first planar coil 11.

By setting the number of winds of the first planar coil 11 to be equal to the number of winds of the second planar coil 12, the magnetic coupling between the first planar coil 11 and the second planar coil 12 can be easy designed.

In the isolator 130 shown in FIG. 8, the metal layer 62 is provided at a level in the Z-direction higher than the upper surface of the second planar coil 12. Moreover, the distance R5 is greater than the distance R4. R5 is the distance from the center of the metal layer 62 to the outer perimeter of the metal layer 62. R4 is the distance from the center of the second planar coil 12 to the inner perimeter of the second planar coil 12. In other words, the second planar coil 12 includes a portion positioned between the first insulating portion 21 and the metal layer 62. Thereby, the electric field intensity can be reduced further at the lower edge LE2 of the inner perimeter in the second planar coil 12.

Thus, in the isolators 100 to 130, the electric field intensity at the lower edge LE1 of the outer perimeter of the second planar coil 12 is reduced by setting the distance R2 from the center of the second planar coil 12 to the outer perimeter of the second planar coil 12 to be greater than the distance R1 from the center of the first planar coil 11 to the outer perimeter of the first planar coil 11. By providing the metal layer 62, the electric field intensity can be reduced at the lower edge LE2 of the inner perimeter in the second planar coil 12, and the dielectric breakdown can be avoided between the first planar coil 11 and the second planar coil 12.

The configurations of the first planar coil 11, the second planar coil 12, and the metal layer 62 in the isolators 100 to 130 can be combined with each other to achieve the desired withstanding strength for the dielectric breakdown between the first planar coil 11 and the second planar coil 12.

Figure 9:
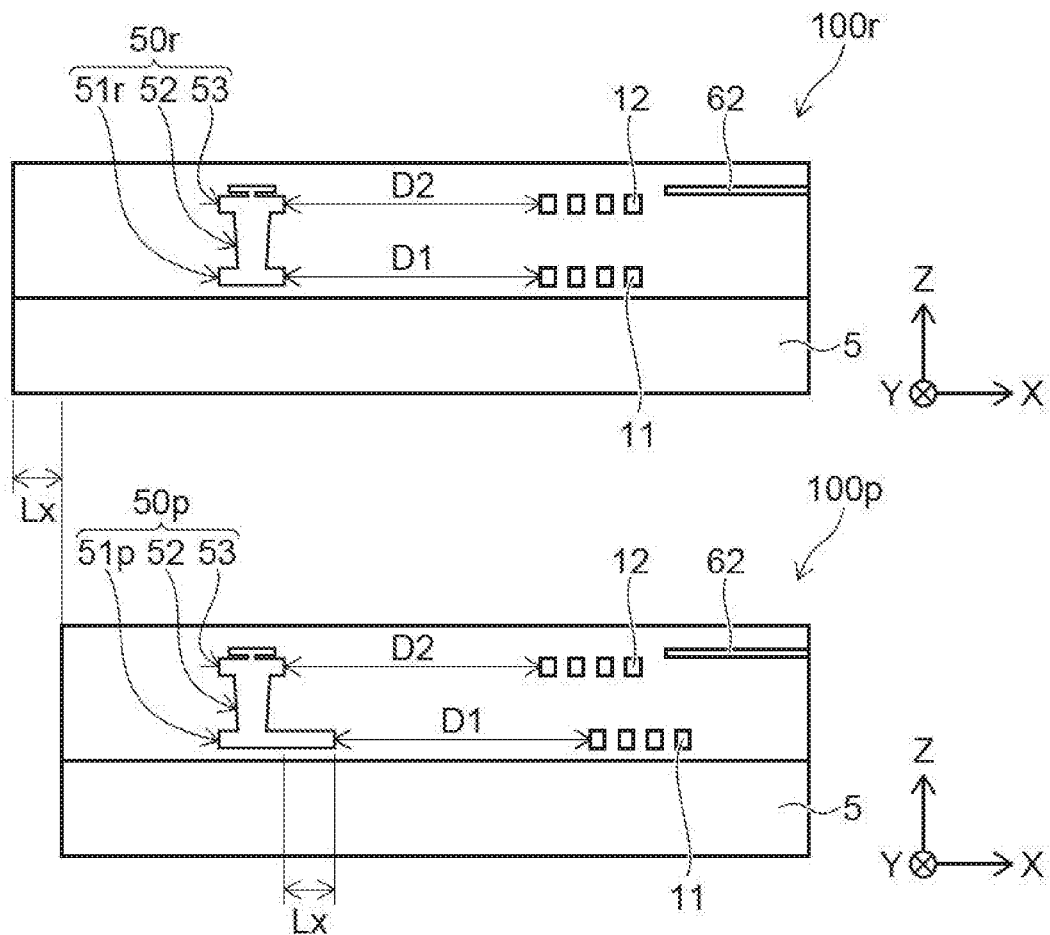

FIG. 9 is a schematic cross-sectional view illustrating an isolator 100r according to a comparative example and an isolator 100p according to a modification of the first embodiment.

The isolator 100r includes the first planar coil 11, the second planar coil 12, the metal layer 62, and a conductive body 50r. The distance R1 from the center of the first planar coil 11 to the outer perimeter of the first planar coil 11

(referring to FIG. 2) is equal to the distance R2 from the center of the second planar coil 12 to the outer perimeter of the second planar coil 12 (referring to FIG. 2).

The conductive body 50r includes a first conductive portion 51r, the second conductive portion 52, and the third conductive portion 53. The conductive body 50r is provided to surround the first planar coil 11 and the second planar coil 12. For example, the distance D1 from the first conductive portion 51r to the first planar coil 11 is substantially equal to the distance D2 from the third conductive portion 53 to the second planar coil 12.

The isolator 100p includes the first planar coil 11, the second planar coil 12, the metal layer 62, and a conductive body 50p. The distance R1 from the center of the first planar coil 11 to the outer perimeter of the first planar coil 11 (referring to FIG. 2) is less than the distance R2 from the center of the second planar coil 12 to the outer perimeter of the second planar coil 12 (referring to FIG. 2).

The conductive body 50p includes a first conductive portion 51p, the second conductive portion 52, and the third conductive portion 53. The conductive body 50p is provided to surround the first planar coil 11 and the second planar coil 12. For example, the distance D1 from the first conductive portion 51p to the first planar coil 11 is substantially equal to the distance D2 from the third conductive portion 53 to the second planar coil 12.

In other words, the first conductive portion 51p extends further toward the first planar coil 11 compared to the first conductive portion 51r. For example, when a circuit (not illustrated) that is connected to the first planar coil 11 is provided at the front side of the substrate 5 between the substrate 5 and the first conductive portion 51p, the first conductive portion 51p can be provided more proximate to the first planar coil 11 in the isolator 100p compared to the isolator 100r. Thereby, the isolator 100p may have, for example, the size reduced in the X-direction by a length Lx that the first conductive portion 51p is elongated toward the first planar coil 11.

Second Embodiment

Figure 10:
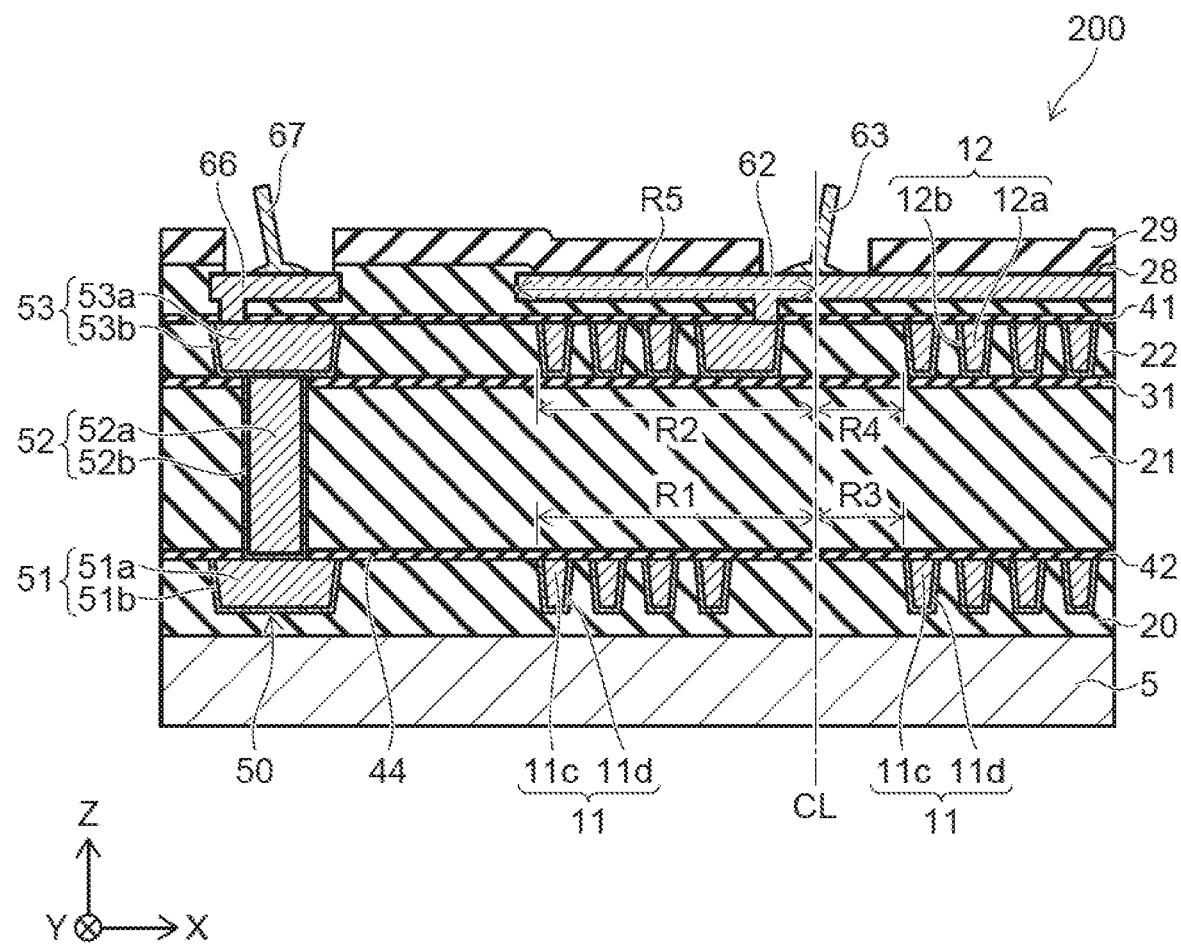
FIG. 10 is a schematic cross-sectional view showing an isolator according to a second embodiment.

FIG. 10 is a schematic cross-sectional view showing an isolator 200 according to a second embodiment. The interconnection layer 70 between the substrate 5 and the insulating portion 20 is not illustrated in FIG. 10. The following drawings also are illustrated in the same manner.

In the isolator 200 as shown in FIG. 10, the distance R5 is set to be greater than the distance R2. R5 is the distance from the center of the metal layer 62 to the outer perimeter of the metal layer 62. R2 is the distance from the center of the second planar coil 12 to the outer perimeter of the second planar coil 12. In the example, the distance R2 is equal to the distance R1. R1 is the distance from the center of the first planar coil 11 to the outer perimeter of the first planar coil 11. Also, the distance R4 may be equal to the distance R3. R4 is the distance from the center of the second planar coil 12 to the inner perimeter of the second planar coil 12. R3 is the distance from the center of the first planar coil 11 to the inner perimeter of the first planar coil 11.

Figure 11A:
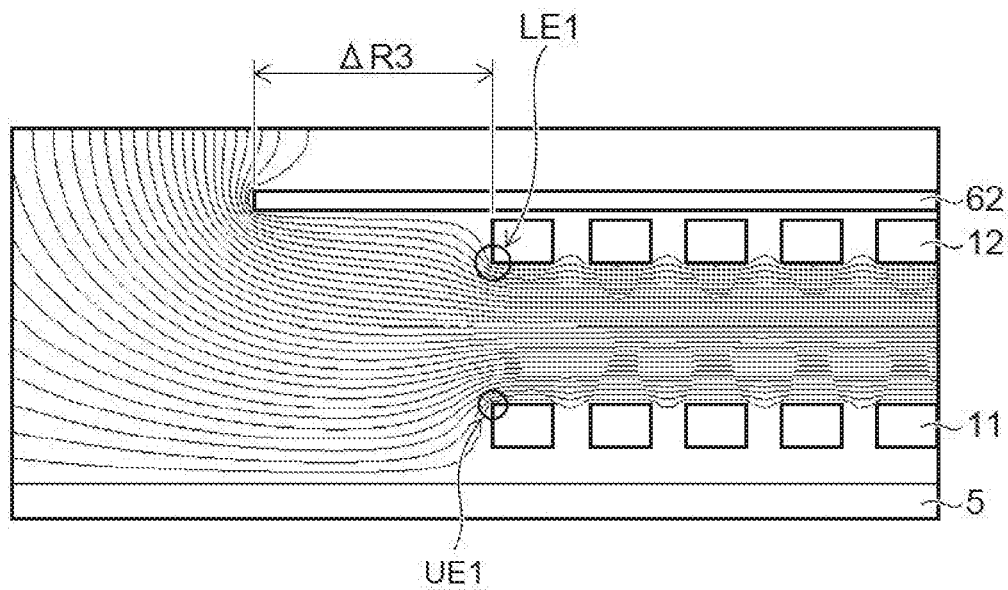
FIGS. 11A and 11B are schematic views showing characteristics of the isolator according to the second embodiment.
Figure 11B:
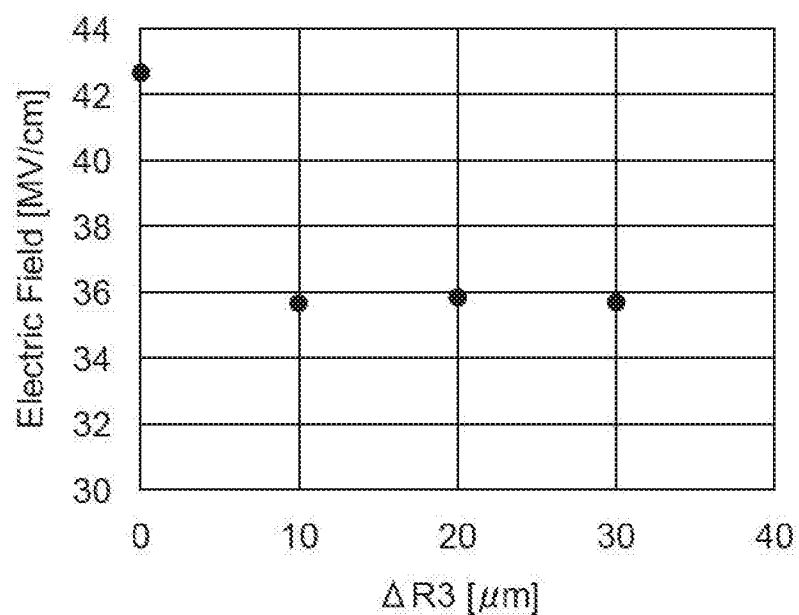

FIGS. 11A and 11B are schematic views showing characteristics of the isolator 200 according to the second embodiment. FIG. 11A is a cross-sectional view showing the electric field distribution between the first planar coil 11 and the second planar coil 12. FIG. 11B is a graph showing the electric field intensity at the lower edge LE1 of the outer perimeter in the second planar coil 12.

As shown in FIG. 11A, it can be seen that the equipotential surface spacing is narrow and the electric field intensity is high at the upper edge UE1 of the outer perimeter in the first planar coil 11, the lower edge LE1 of the outer perimeter in the second planar coil 12, and the outer perimeter of the metal layer 62.

For example, the outer perimeter of the metal layer 62 is provided at a position where the distance from the first planar coil 11 is long; and there is the low likelihood that the outer perimeter of the metal layer 62 contributes to dielectric breakdown by the electric field concentration. Moreover, the electric field intensity at the upper edge UE1 of the first planar coil 11 is less than the electric field intensity at the lower edge LE1 of the second planar coil 12. Therefore, to avoid the dielectric breakdown between the first planar coil 11 and the second planar coil, it is sufficient to reduce the electric field intensity at the lower edge LE1 of the second planar coil 12.

FIG. 11B is a graph illustrating the change of the electric field intensity at the lower edge LE1 of the second planar coil 12. The vertical axis is the electric field intensity at the lower edge LE1, and the horizontal axis is a difference $\Delta R3$ (=R5−R2) between the distance R5 from the center of the metal layer 62 to the outer perimeter of the metal layer 62 and the distance R2 from the center of the second planar coil 12 to the outer perimeter of the second planar coil 12.

As shown in FIG. 11B, the electric field intensity at the lower edge LE1 decreases when $\Delta R3$ is greater than zero. In other words, the electric field intensity can be reduced at the lower edge LE1 of the second planar coil 12, because the end of the metal layer 62 protrudes outward from the outer perimeter of the second planar coil 12. Simultaneously, the electric field intensity is reduced further at the upper edge UE1 of the first planar coil 11.

Thus, in the isolator 200, by setting the distance R5 from the center of the metal layer 62 to the outer perimeter of the metal layer 62 to be greater than the distance R2 from the center of the second planar coil 12 to the outer perimeter of the second planar coil 12, the electric field concentration can be relaxed at the lower edge LE2 of the second planar coil 12, and the dielectric breakdown can be avoided between the first planar coil 11 and the second planar coil 12.

Figure 12:
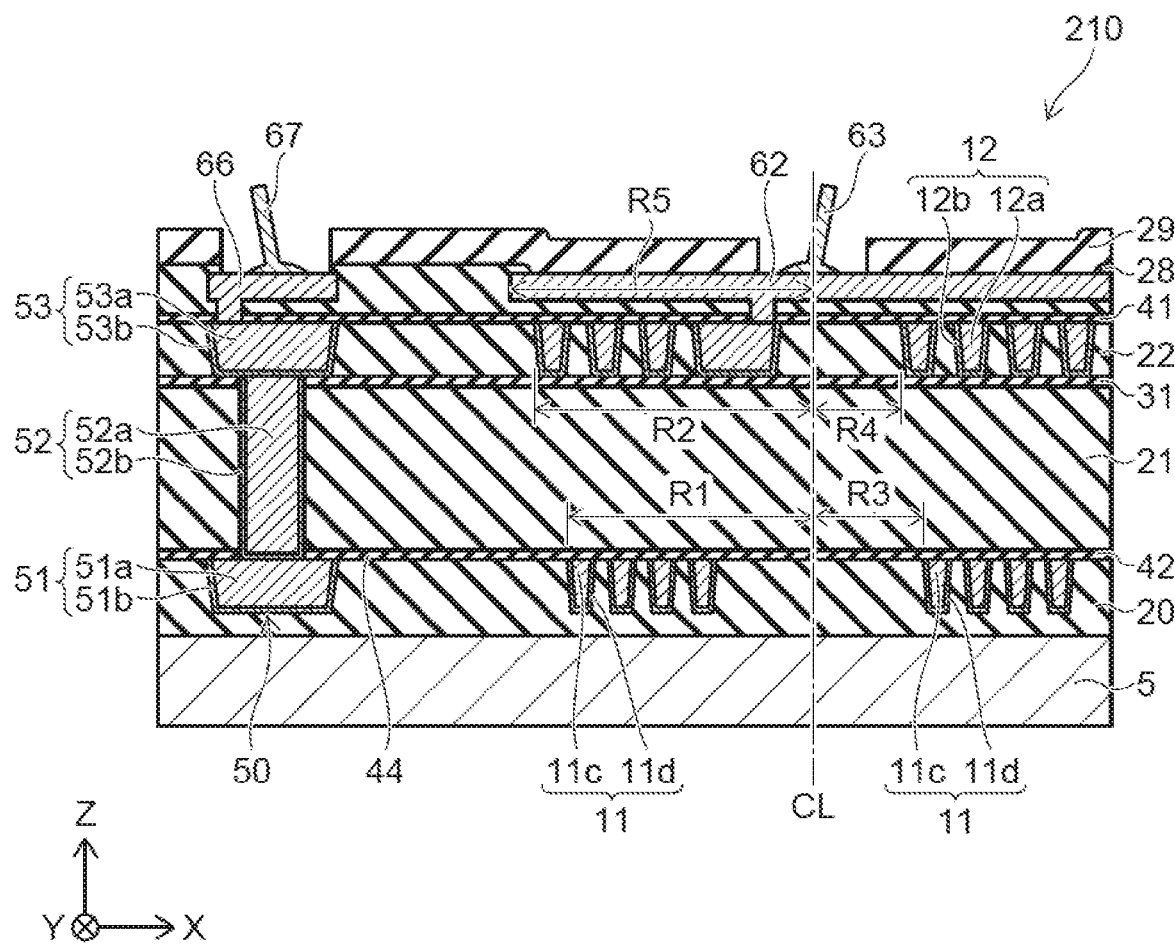
FIG. 12 is a schematic cross-sectional view illustrating an isolator according to a modification of the second embodiment.

FIG. 12 is a schematic cross-sectional view illustrating an isolator 210 according to a modification of the second embodiment. In the isolator 210, the distance R5 from the center of the metal layer 62 to the outer perimeter of the metal layer 62 is set to be greater than the distance R2 from the center of the second planar coil 12 to the outer perimeter of the second planar coil 12.

Also, the distance R2 from the center of the second planar coil 12 to the outer perimeter of the second planar coil 12 is greater than the distance R1 from the center of the first planar coil 11 to the outer perimeter of the first planar coil 11. The distance R4 from the center of the second planar coil 12 to the inner perimeter of the second planar coil 12 is less than the distance R3 from the center of the first planar coil 11 to the inner perimeter of the first planar coil 11. Thereby, the electric field concentration can be relaxed further at the lower edge LE2 of the second planar coil 12, and the dielectric breakdown can be avoided between the first planar coil 11 and the second planar coil 12.

The isolators according to the second embodiment are not limited to the examples described above; for example, the first planar coil 11 and the second planar coil 12 shown in FIG. 2 may be provided therein.

Third Embodiment

Figure 13:
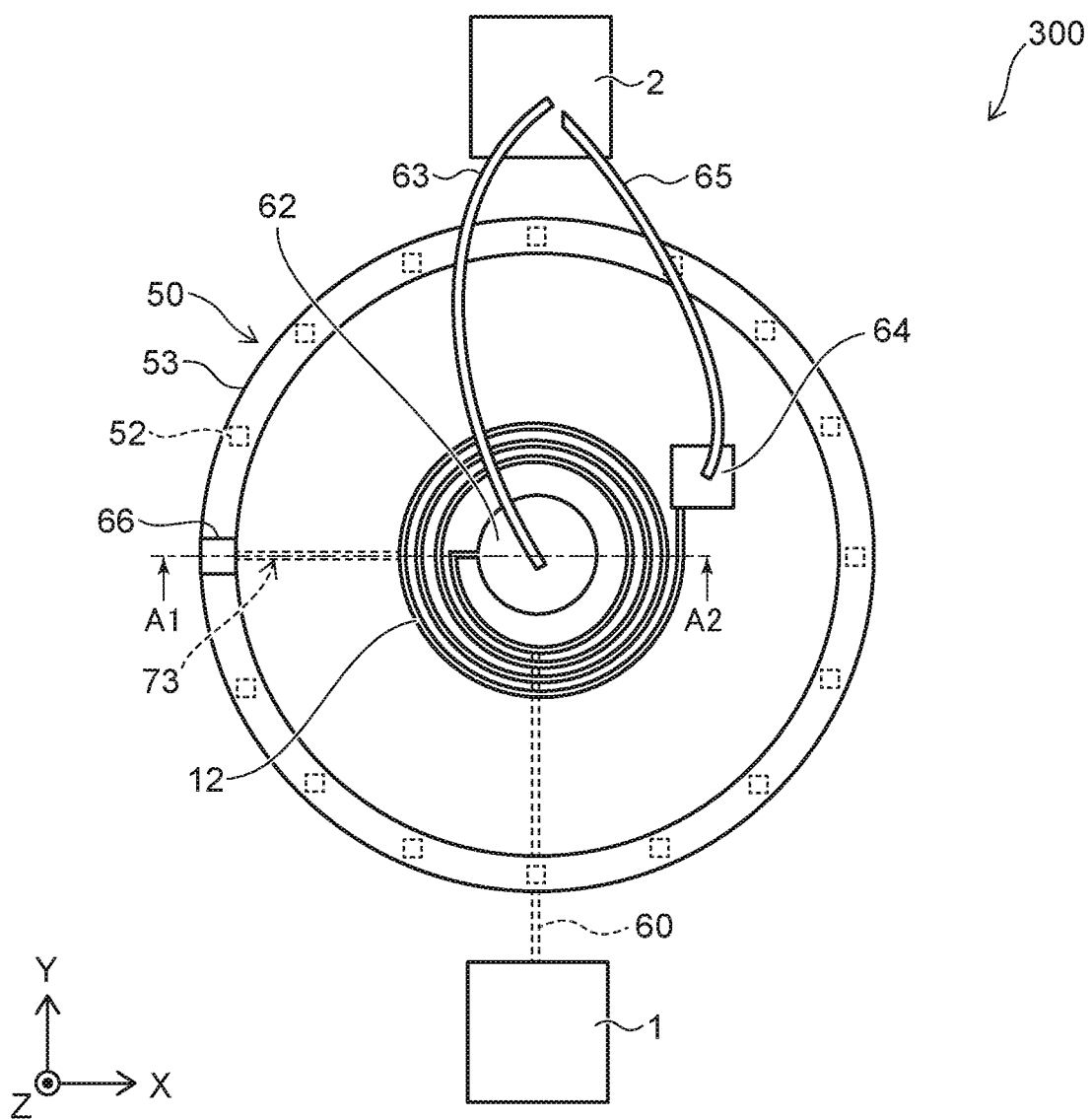
FIG. 13 is a plan view illustrating an isolator according to a third embodiment.

FIG. 13 is a plan view illustrating an isolator 300 according to a third embodiment.

Figure 14:
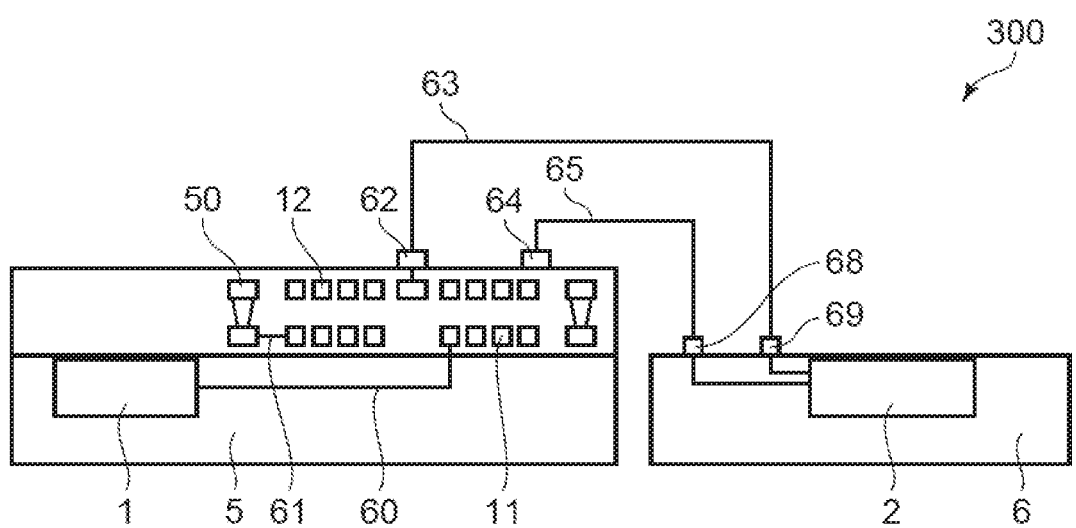
FIG. 14 is a schematic view illustrating the cross-sectional structure of the isolator according to the third embodiment.

FIG. 14 is a schematic view illustrating the cross-sectional structure of the isolator 300 according to the third embodiment.

In the isolator 300 according to the third embodiment, the first planar coil 11 has one end at the outer perimeter portion that is electrically connected to the conductive body 50 via the interconnection 73 as illustrated in FIG. 13. The other end of the first planar coil 11 is electrically connected to the first circuit 1 via the wiring 60.

As illustrated in FIG. 14, the first circuit 1 is provided inside the substrate 5. The second circuit 2 is provided inside a substrate 6 that is separated from the substrate 5. The metal layer 62 is electrically connected via the wiring 63 to a metal layer 69 provided on the substrate 6. The metal layer 64 is electrically connected via the wiring 65 to a metal layer 68 provided on the substrate 6. The second circuit 2 is electrically connected to the metal layers 68 and 69.

According to the embodiments, the structures described above are applicable to the structure of the isolator 300 provided above the substrate 5. The electric field intensity can be reduced thereby in the vicinity of the lower edge at the end surface of the second planar coil 12.

Figure 15:
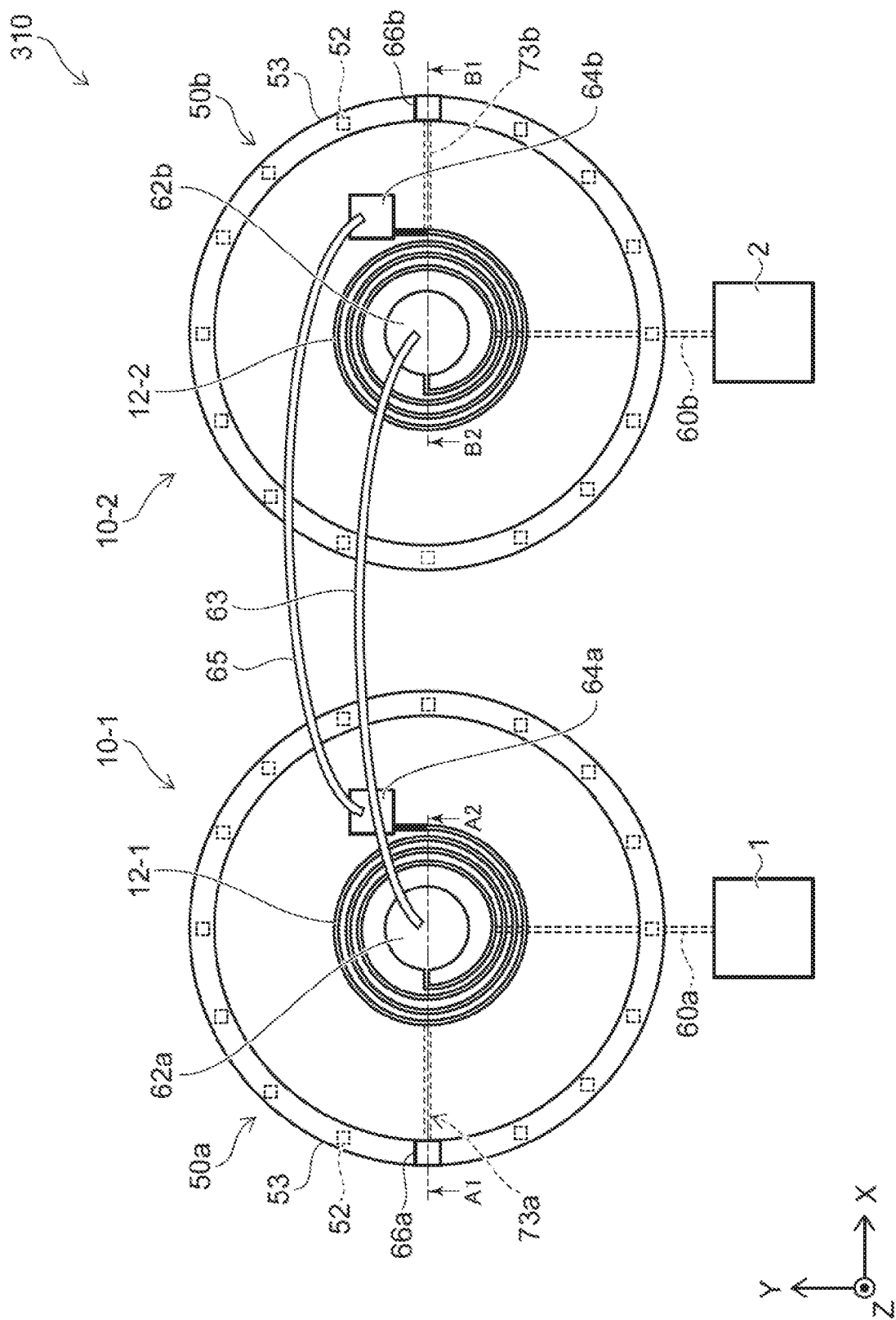
FIG. 15 is a plan view illustrating an isolator according to a first modification of the third embodiment.

FIG. 15 is a plan view illustrating an isolator 310 according to a first modification of the third embodiment.

Figure 16:
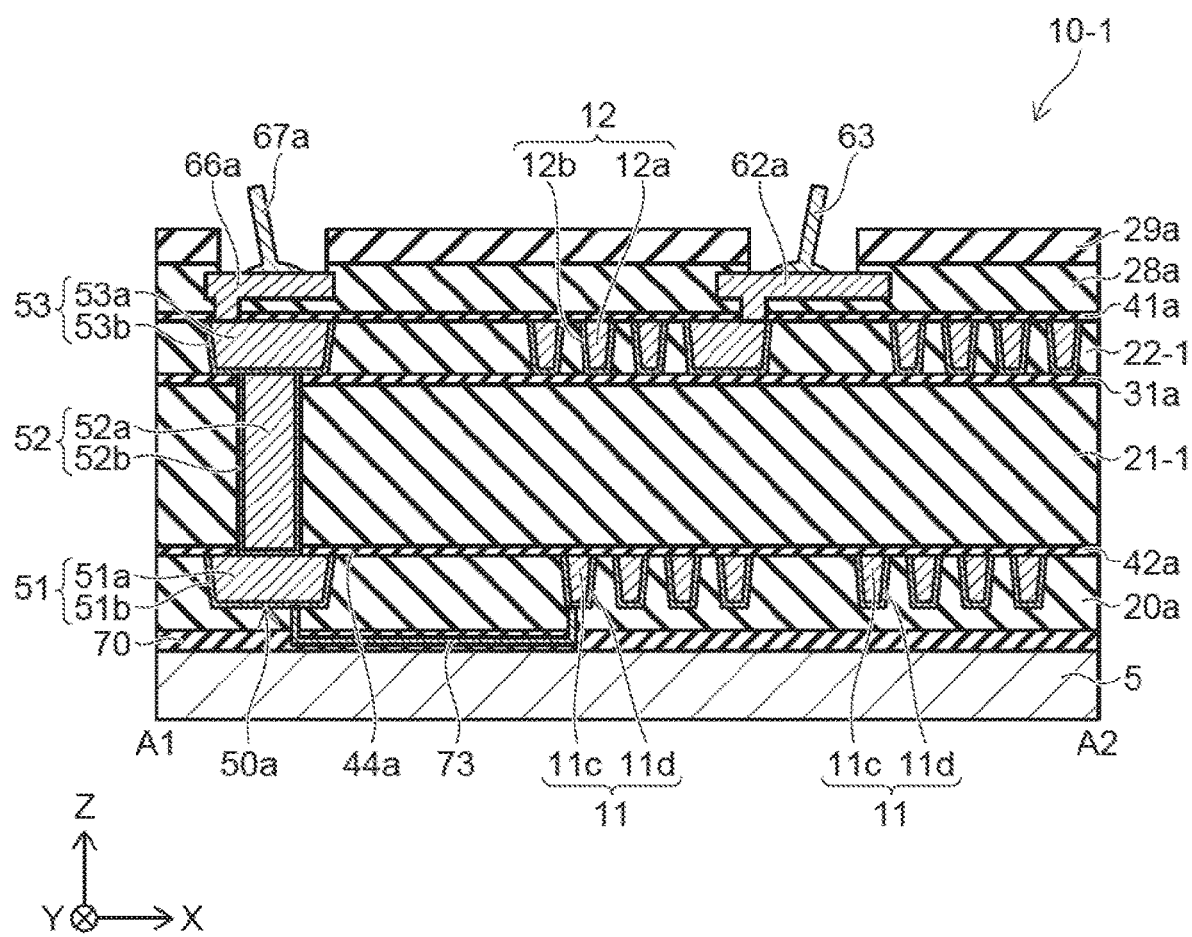
FIG. 16 is an A1-A2 cross-sectional view of FIG. 15.
Figure 17:
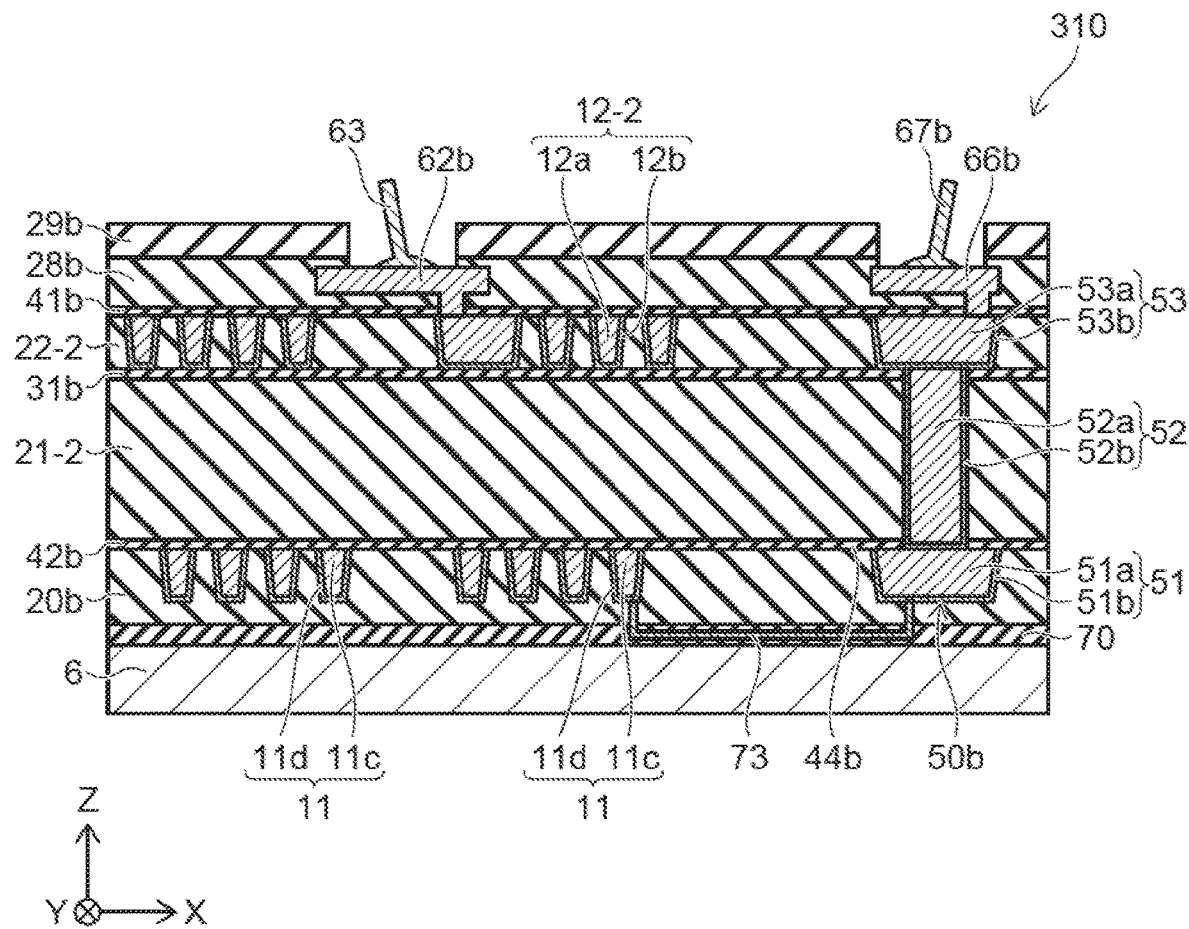
FIG. 17 is a B1-B2 cross-sectional view of FIG. 15.

FIG. 16 is an A1-A2 cross-sectional view of FIG. 15. FIG. 17 is a B1-B2 cross-sectional view of FIG. 15.

Figure 18:
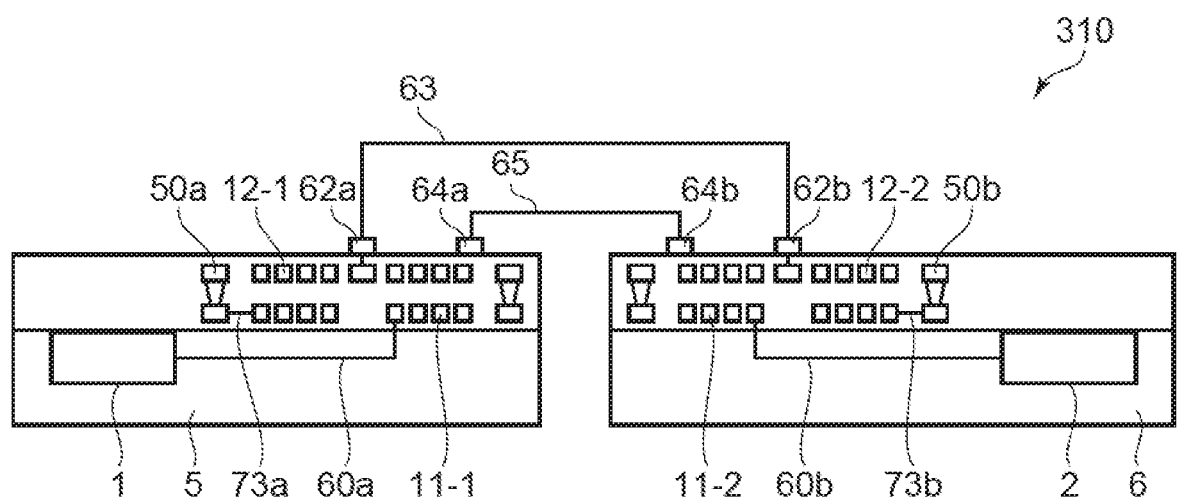
FIG. 18 is a schematic view illustrating the cross-sectional structure of the isolator according to the first modification of the third embodiment.

FIG. 18 is a schematic view illustrating the cross-sectional structure of the isolator 310 according to the first modification of the third embodiment.

The isolator 310 according to the first modification includes a first structure body 10-1 and a second structure body 10-2 as illustrated in FIG. 15.

The first structure body 10-1 includes a planar coil 11-1, a planar coil 12-1, an insulating portion 21-1, an insulating portion 22-1, a dielectric portion 31a, a dielectric portion 41a, a dielectric portion 42a, a conductive body 50a, a metal layer 62a, a metal layer 64a, and a metal layer 66a as illustrated in FIGS. 15, 16, and 18.

For example, the structures of the planar coil 11-1, the planar coil 12-1, the insulating portion 21-1, the insulating portion 22-1, the dielectric portion 31a, the dielectric portion 41a, the dielectric portion 42a, the conductive body 50a, the metal layer 62a, the metal layer 64a, and the metal layer 66a are respectively similar to the structures of the first planar coil 11, the second planar coil 12, the first insulating portion 21, the second insulating portion 22, the dielectric portion 31, the dielectric portion 41, the dielectric portion 42, the conductive body 50, the metal layer 62, the metal layer 64, and the metal layer 66 illustrated in FIG. 2.

The second structure body 10-2 includes a planar coil 11-2, a planar coil 12-2, an insulating portion 21-2, an insulating portion 22-2, a dielectric portion 31b, a dielectric portion 41b, a dielectric portion 42b, a conductive body 50b, a metal layer 62b, a metal layer 64b, and a metal layer 66b as illustrated in FIGS. 15, 17, and 18.

For example, the structures of the planar coil 11-2, the planar coil 12-2, the insulating portion 21-2, the insulating portion 22-2, the dielectric portion 31b, the dielectric portion 41b, the dielectric portion 42b, the conductive body 50b, the metal layer 62b, the metal layer 64b, and the metal layer 66b are respectively similar to the structures of the first planar coil 11, the second planar coil 12, the first insulating portion 21, the second insulating portion 22, the dielectric portion 31, the dielectric portion 41, the dielectric portion 42, the conductive body 50, the metal layer 62, the metal layer 64, and the metal layer 66 illustrated in FIG. 2.

As illustrated in FIG. 15, the metal layer 62a is electrically connected to the metal layer 62b by the wiring 63. The metal layer 64a is electrically connected to the metal layer 64b by the wiring 65.

The metal layer 66a is electrically connected to another conductive member by wiring 67a. The metal layer 66b is electrically connected to yet another conductive member by wiring 67b.

As illustrated in FIG. 18, the first circuit 1 is provided inside the substrate 5. The first structure body 10-1 is provided on the substrate 5. The second circuit 2 is provided inside the substrate 6. The second structure body 10-2 is provided on the substrate 6. One end of the planar coil 11-1 is electrically connected to the conductive body 50a. The other end of the planar coil 11-1 is electrically connected to the first circuit 1. One end of the planar coil 11-2 is electrically connected to the conductive body 50b. The other end of the planar coil 11-2 is electrically connected to the second circuit 2.

According to the embodiments, the structures described above are applicable to the structures of the isolator 310 provided above the substrate 5 and above the substrate 6. The electric field intensity can be reduced thereby in the vicinity of the lower edge at the end surface of the planar coil 12-1. Also, the electric field intensity can be reduced in the vicinity of the lower edge at the end surface of the planar coil 12-2. In the isolator 310 illustrated in FIGS. 15 to 18, the pair of planar coils 11-1 and 12-1 are connected in series to the pair of planar coils 11-2 and 12-2. In other words, the first circuit 1 and the second circuit 2 are doubly insulated from each other by two pairs of planar coils connected in series. According to the isolator 310, the insulation reliability can be improved, compared to the structure insulated singly by one pair of planar coils.

Figure 19:
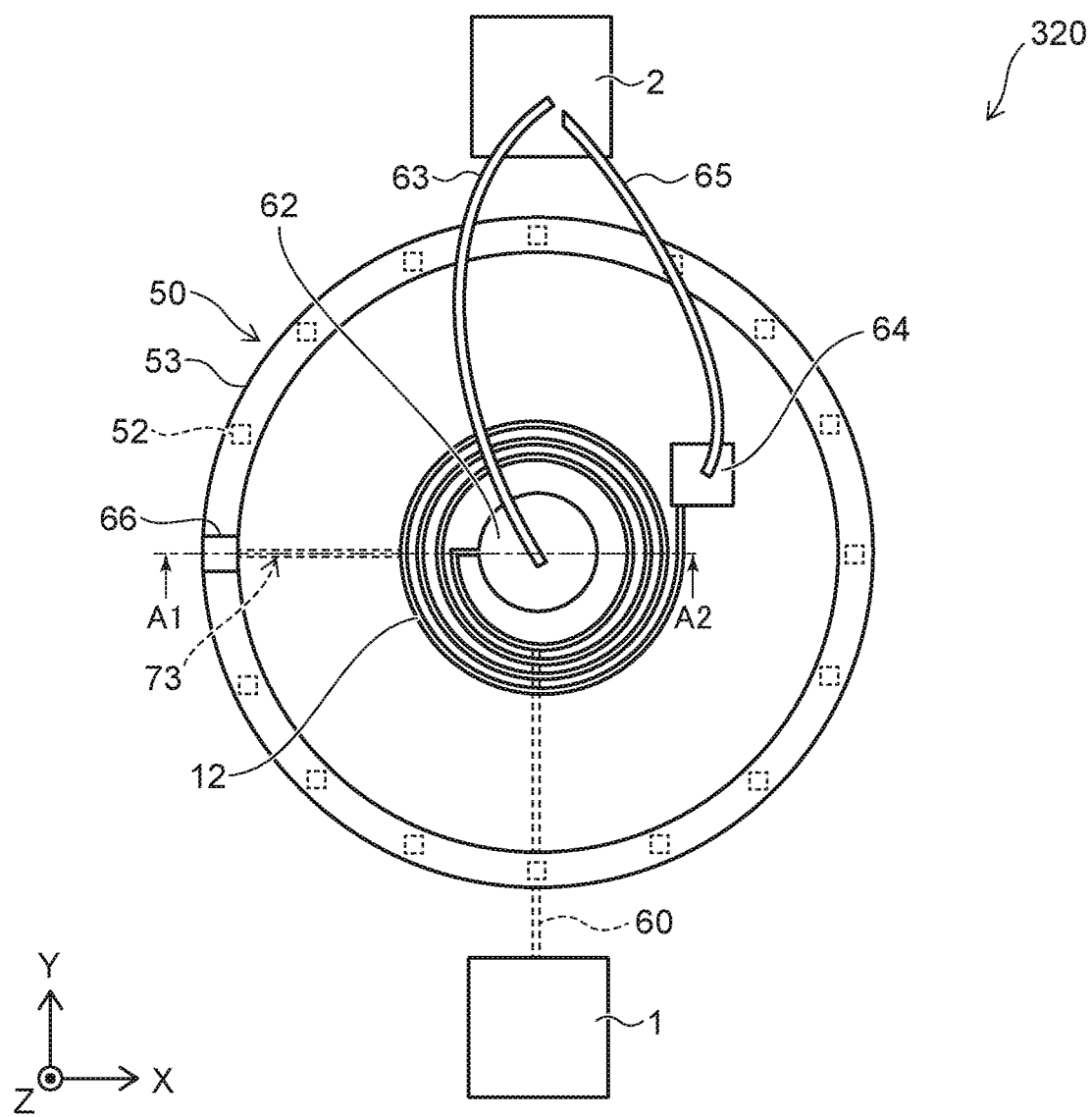
FIG. 19 is a plan view illustrating an isolator according to a second modification of the third embodiment.

FIG. 19 is a plan view illustrating an isolator 320 according to a second modification of the third embodiment.

Figure 20:
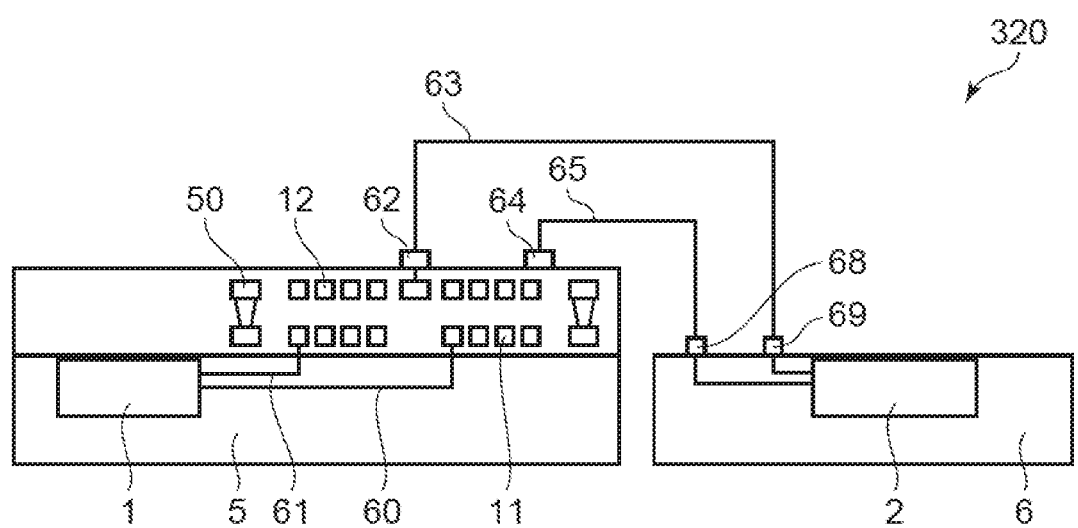
FIG. 20 iS a schematic view illustrating the cross-sectional structure of the isolator according to the second modification of the third embodiment.

FIG. 20 is a schematic view illustrating the cross-sectional structure of the isolator 320 according to the second modification of the third embodiment.

According to the second modification of the third embodiment, as illustrated in FIGS. 19 and 20, the isolator 320 differs from the isolator 300 in that the two ends of the first planar coil 11 are electrically connected to the first circuit 1. The conductive body 50 is electrically isolated from the first circuit 1 and the first planar coil 11. As long as the conductive body 50 is set to the reference potential, the electrical connections of the first circuit 1, the first planar coil 11, and the conductive body 50 can be modified appropriately therebetween.

Figure 21:
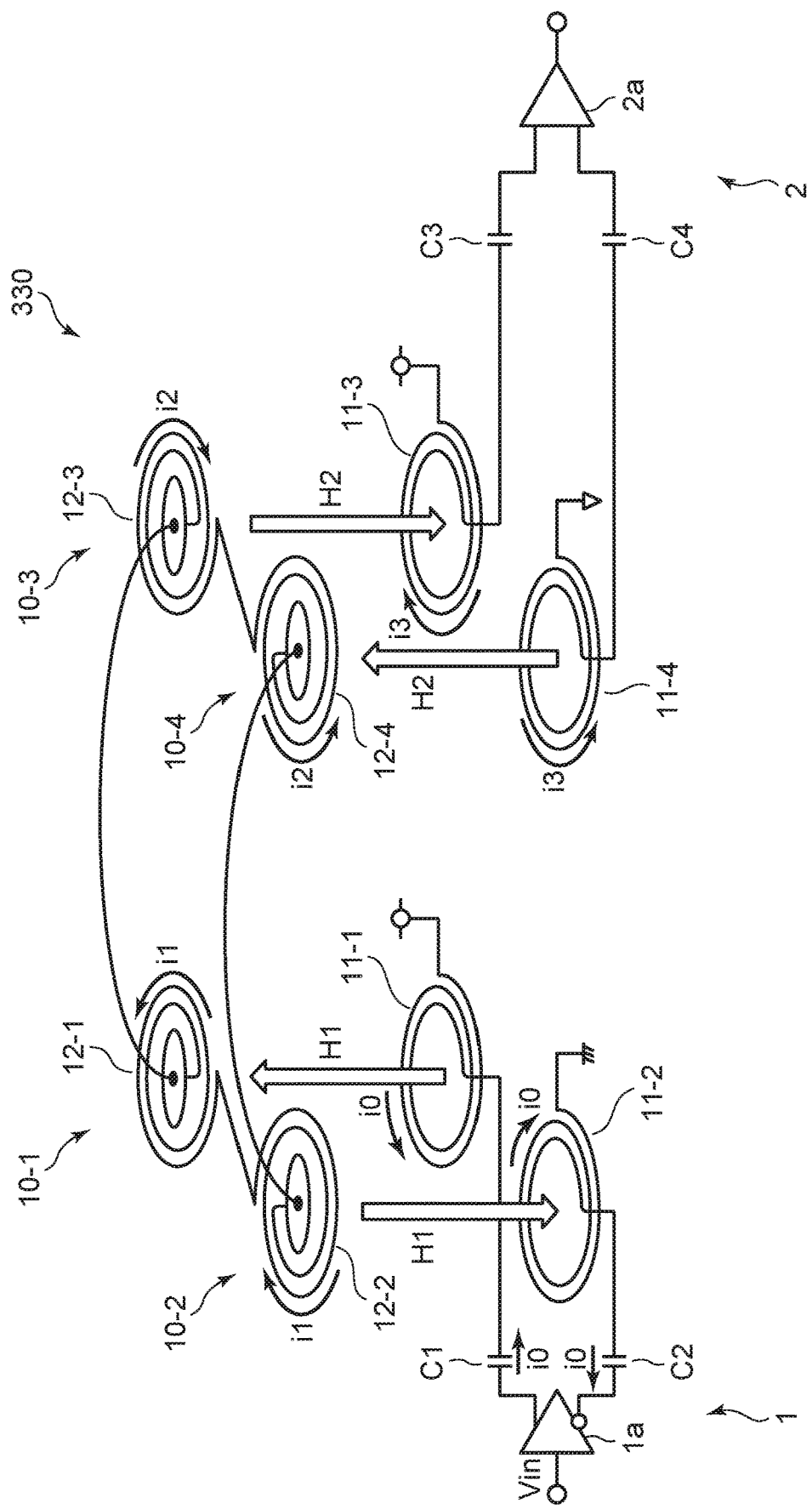
FIG. 21 is a schematic view illustrating an isolator according to a third modification of the third embodiment.

FIG. 21 is a schematic view illustrating an isolator 330 according to a third modification of the third embodiment.

The isolator 330 according to the third modification includes the first structure body 10-1, the second structure body 10-2, a third structure body 10-3, and a fourth structure body 10-4. The first structure body 10-1 includes the planar coil 11-1 and the planar coil 12-1. The second structure body 10-2 includes the planar coil 11-2 and the planar coil 12-2. The third structure body 10-3 includes a planar coil 11-3 and a planar coil 12-3. The fourth structure body 10-4 includes a planar coil 11-4 and a planar coil 12-4. The first circuit 1 includes a differential driver circuit 1a, a capacitance C1, and a capacitance C2. The second circuit 2 includes a differential receiving circuit 2a, a capacitance C3, and a capacitance C4.

For example, the differential driver circuit 1a, the capacitance C1, the capacitance C2, the planar coil 11-1, the planar coil 11-2, the planar coil 12-1, and the planar coil 12-2 are formed on a first substrate (not-illustrated). One end of the planar coil 11-1 is connected to a first constant potential. The other end of the planar coil 11-1 is connected to the capacitance C1. One end of the planar coil 11-2 is connected to a second constant potential. The other end of the planar coil 11-2 is connected to the capacitance C2.

One output of the differential driver circuit 1*a* is connected to the capacitance C1. The other output of the differential driver circuit 1*a* is connected to the capacitance C2. The capacitance C1 is connected to the differential driver circuit 1*a* and the planar coil 11-1. The capacitance C2 is connected to the differential driver circuit 1*a* and the planar coil 11-2.

The planar coil 11-1 and the planar coil 12-1 are stacked with an insulating portion interposed. The planar coil 11-2 and the planar coil 12-2 are stacked with another insulating portion interposed. One end of the planar coil 12-1 is connected to one end of the planar coil 12-2.

For example, the differential receiving circuit 2*a*, the capacitance C3, the capacitance C4, the planar coil 11-3, the planar coil 11-4, the planar coil 12-3, and the planar coil 12-4 are formed on a second substrate (not-illustrated). One end of the planar coil 11-3 is connected to a third constant potential. The other end of the planar coil 11-3 is connected to the capacitance C3. One end of the planar coil 11-4 is connected to a fourth constant potential. The other end of the planar coil 11-4 is connected to the capacitance C4.

One input of the differential receiving circuit 2*a* is connected to the capacitance C3. The other input of the differential receiving circuit 2*a* is connected to the capacitance C4. The planar coil 11-3 and the planar coil 12-3 are stacked with an insulating portion interposed. The planar coil 11-4 and the planar coil 12-4 are stacked with another insulating portion interposed. One end of the planar coil 12-3 is connected to one end of the planar coil 12-4. The other end of the planar coil 12-3 is connected to the other end of the planar coil 12-1. The other end of the planar coil 12-4 is connected to the other end of the planar coil 12-2.

An operation thereof will now be described. A modulated signal is transmitted in the isolators. In FIG. 21, Vin is the modulated signal. For example, an edge-triggered technique or on-off keying is used to modulate the signal. In any technique, Vin is the original signal shifted toward the high frequency band.

The differential driver circuit 1*a* causes a current i0 to flow through the planar coil 11-1 and the planar coil 11-2 in mutually-reverse directions. The current i0 corresponds to Vin. The planar coils 11-1 and 11-2 generate magnetic fields (H1) having mutually-reverse orientations. When the number of winds of the planar coil 11-1 is equal to the number of winds of the planar coil 11-2, the magnitudes of the generated magnetic fields are equal.

The induced voltage that is generated in the planar coil 12-1 by a magnetic field H1 is added to the induced voltage generated in the planar coil 12-2 by the magnetic field H1. A current i1 flows in the planar coil 12-1 and 12-2. The planar coil 12-1 and 12-2 are connected respectively to the planar coil 12-3 and the planar coil 12-4 by bonding wires. The bonding wires include, for example, gold. The diameters of the bonding wires are, for example, 30 µm.

The sum of the induced voltages of the planar coils 12-1 and 12-2 is applied to the planar coils 12-3 and 12-4. A current i2 flows in the planar coils 12-3 and 12-4. The current i2 is the same as the current i1 flowing in the planar coil 12-1 and the planar coil 12-2. The planar coils 12-3 and 12-4 generate magnetic fields (H2) having mutually-reverse orientations. When the number of winds of the planar coil 12-3 is equal to the number of winds of the planar coil 12-4, the magnitudes of the generated magnetic fields are equal.

The direction of the induced voltage generated in the planar coil 11-3 by the magnetic field H2 is the reverse of the direction of the induced voltage generated in the planar coil 11-4 by the magnetic field H2. A current i3 flows in the planar coil 11-3 and 11-4. The magnitude of the induced voltage generated in the planar coil 11-3 is equal to the magnitude of the induced voltage generated in the planar coil 11-4. The sum of the voltages induced in the planar coil 11-3 and 11-4 is applied to the differential receiving circuit 2*a*, and the modulated signal is transmitted thereto.

Figure 22:
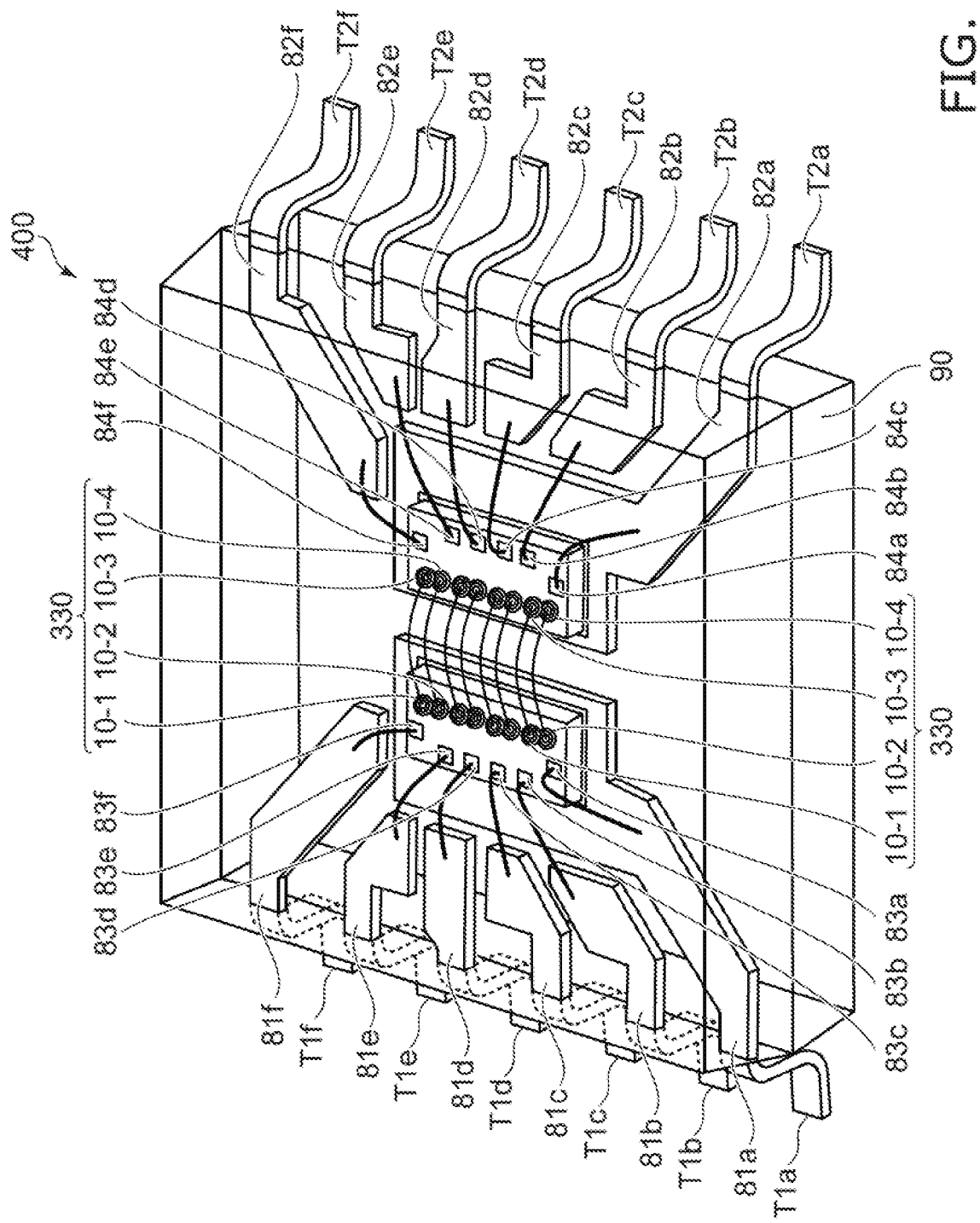
FIG. 22 is a perspective view illustrating a package according to a fourth embodiment.

FIG. 22 is a perspective view illustrating a package 400 according to a fourth embodiment.

Figure 23:
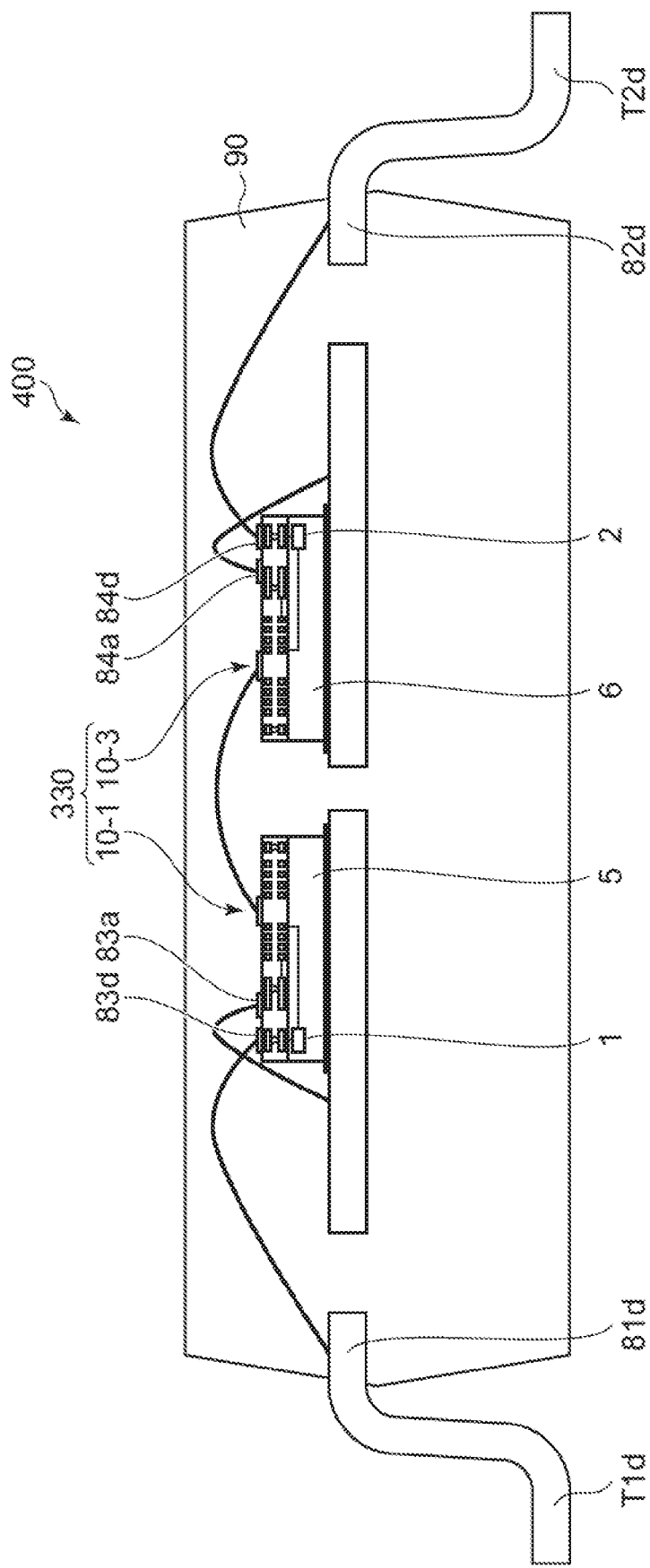
FIG. 23 is a schematic view illustrating the cross-sectional structure of the package according to the fourth embodiment.

FIG. 23 is a schematic view illustrating the cross-sectional structure of the package 400 according to the fourth embodiment.

According to the fourth embodiment, as illustrated in FIG. 22, the package 400 includes metal members 81*a* to 81*f*, metal members 82*a* to 82*f*, metal layers 83*a* to 83*f*, metal layers 84*a* to 84*f*, a sealing portion 90, and multiple isolators 330.

In the example illustrated, the package 400 includes four isolators 330. In other words, four sets of the first to fourth structure bodies 10-1 to 10-4 are provided, which are illustrated in FIG. 21.

The metal member 81*a* includes a portion on which the multiple first structure bodies 10-1 and the multiple second structure bodies 10-2 are provided. For example, the multiple first structure bodies 10-1 and the multiple second structure bodies 10-2 are provided on one substrate 5. The substrate 5 is electrically connected to the metal member 81*a*. Multiple first circuits 1 that correspond respectively to the first structure body 10-1 and the second structure body 10-2 are provided inside the substrate 5.

The metal member 82*a* includes a portion on which the multiple third structure bodies 10-3 and the multiple fourth structure bodies 10-4 are provided. The multiple third structure bodies 10-3 and the multiple fourth structure bodies 10-4 are provided on one substrate 6. The substrate 6 is electrically connected to the metal member 82*a*. Multiple second circuits 2 that correspond respectively to the third structure body 10-3 and the fourth structure body 10-4 are provided inside the substrate 6.

The metal member 81*a* is electrically connected to the metal layer 83*a*. The metal layer 83*a* is electrically connected to the conductive bodies 50*a* of the first structure body 10-1 and the second structure body 10-2. The metal member 82*a* is electrically connected to the metal layer 84*a*. The metal layer 84*a* is electrically connected to the conductive bodies 50*b* of the third structure body 10-3 and the fourth structure body 10-4.

The metal members 81*b* to 81*e* are electrically connected respectively to the metal layers 83*b* to 83*e*. The metal layers 83*b* to 83*e* are electrically connected respectively to the multiple first circuits 1. The metal member 81*f* is electrically connected to the metal layer 83*f*. The metal layer 83*f* is electrically connected to the multiple first circuits 1.

The metal members 82*b* to 82*e* are electrically connected respectively to the metal layers 84*b* to 84*e*. The metal layers 84*b* to 84*e* are electrically connected respectively to the multiple second circuits 2. The metal member 82*f* is electrically connected to the metal layer 84*f*. The metal layer 84*f* is electrically connected to the multiple second circuits 2.

The sealing portion 90 covers the multiple isolators 330, the metal layers 84*a* to 84*f*, the metal layers 83*a* to 83*f*, and portions of the metal members 81*a* to 81*f* and 82*a* to 82*f*.

The metal members 81a to 81f respectively include terminals T1a to T1f. The metal members 82a to 82f respectively include terminals T2a to T2f. The terminals T1a to T1f and T2a to T2f are not covered with the sealing portion 90 and are exposed externally.

For example, the terminals T1a and T2a are connected to a reference potential. Signals supplied to the first circuits 1 are input to the terminals T1b to T1e, respectively. Signals output from the second circuits 2 are output via the terminals T2b to T2e, respectively. The terminal T1f is connected to a power supply for driving the multiple first circuits 1. The terminal T2f is connected to a power supply for driving the multiple second circuits 2.

According to the fourth embodiment, it is possible to reduce the likelihood of the isolators broken in the package 400. Although an example is described in which four isolators 330 are provided, one or more other isolators may be provided in the package 400.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An isolator, comprising:
a substrate;
a first planar coil provided above the substrate, the first planar coil being provided along a surface of the substrate and including a first conductor winded in a plane along the surface of the substrate;
a first insulating portion provided on the first planar coil;
a second planar coil provided on the first insulating portion and including a second conductor winded in a plane along a surface of the first insulating portion; and
a metal layer provided above the first insulating portion,
the first planar coil, the second planar coil, and the metal layer being arranged in a first direction perpendicular to the surface of the substrate,
the first planar coil and the second planar coil each having a center and an outer perimeter in a second direction along the surface of the substrate, a first distance in the second direction from the center of the first planar coil to the outer perimeter of the first planar coil being less than a second distance in the second direction from the center of the second planar coil to the outer perimeter of the second planar coil,
a difference between the first distance and the second distance being larger than a width in the second direction of the second conductor of the second planar coil,
the first planar coil and the second planar coil each having an inner perimeter in the second direction, a third distance in the second direction from the center of the first planar coil to the inner perimeter of the first planar coil being larger than a fourth distance in the second direction from the center of the second planar coil to the inner perimeter of the second planar coil,
a difference between the third distance and the fourth distance being larger than the width in the second direction of the second conductor of the second planar coil,
a spacing between the first planar coil and the second planar coil being larger than a spacing between the substrate and the first planar coil.

2. The isolator according to claim 1, wherein the center of the first planar coil, the center of the second planar coil, and a center of the metal layer are aligned in the first direction.

3. The isolator according to claim 1, further comprising:
a second insulating portion provided on the first insulating portion; and
a third insulating portion provided on the second insulating portion,
the second planar coil being provided inside the second insulating portion,
the metal layer being provided inside the third insulating portion.

4. The isolator according to claim 1, wherein the metal layer is electrically connected to the second planar coil.

5. The isolator according to claim 1, wherein
the metal layer has a center and an outer perimeter in the second direction, and
a distance in the second direction from the center of the metal layer to the outer perimeter of the metal layer is less than a distance in the second direction from the center of the second planar coil to the inner perimeter of the second planar coil.

6. The isolator according to claim 5, wherein the second planar coil and the metal layer include portions facing each other in the second direction.

7. The isolator according to claim 6, further comprising:
a second insulating portion provided on the first insulating portion,
the second planar coil being provided inside the second insulating portion,
the metal layer including a first portion, and a second portion electrically connected to the first portion, the second portion being provided above the first portion,
the first portion of the metal layer being provided inside the second insulating portion, the first portion of the metal layer facing the second planar coil via a portion of the second insulating portion.

8. The isolator according to claim 7, further comprising:
a third insulating portion provided on the second insulating portion, the second portion of the metal layer being provided inside the third insulating portion.

9. The isolator according to claim 1, wherein
a spacing in the first direction between the substrate and the metal layer is greater than a spacing in the first direction between the substrate and the second planar coil.

10. The isolator according to claim 1, wherein the second planar coil includes a portion provided between the first insulating portion and the metal layer.

11. The isolator according to claim 10, wherein
the first portion of the metal layer includes a material same as a material of the second planar coil.

12. The isolator according to claim 1, further comprising:
a conductive body provided above the substrate, the conductive body extending along the surface of the substrate, the conductive body surrounding the first planar coil and the second planar coil; and
an interconnection layer provided between the substrate and the first planar coil, the interconnection layer including an interconnection electrically connecting the conductive body and the first planar coil.

13. The isolator according to claim 12, wherein
a distance between the conductive body and the first planar coil is substantially equal to a distance between the conductive body and the second planar coil.

14. The isolator according to claim 1, further comprising:
a first dielectric portion provided between the first planar coil and the first insulating portion; and
a second dielectric portion provided between the first insulating portion and the second planar coil,
the first insulating portion contacting the first dielectric portion and the second dielectric portion.

15. The isolator according to claim 1, further comprising:
a transmitting circuit; and
a receiving circuit,
one of the transmitting circuit and the receiving circuit being connected to the metal layer and one end of the second planar coil.

\* \* \* \* \*